(12) United States Patent
Suzawa et al.

(10) Patent No.: US 10,103,271 B2
(45) Date of Patent: Oct. 16, 2018

(54) SEMICONDUCTOR DEVICE

(71) Applicant: Semiconductor Energy Laboratory Co., Ltd., Atsugi-shi, Kanagawa-ken (JP)

(72) Inventors: Hideomi Suzawa, Kanagawa (JP); Tetsuhiro Tanaka, Kanagawa (JP); Yuhei Sato, Kanagawa (JP); Sachiaki Tezuka, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/879,023

(22) Filed: Jan. 24, 2018

(65) Prior Publication Data

US 2018/0151750 A1 May 31, 2018

Related U.S. Application Data

(63) Continuation of application No. 15/270,064, filed on Sep. 2, 2016, now Pat. No. 9,887,295, which is a
(Continued)

(30) Foreign Application Priority Data

Oct. 22, 2013 (JP) .................................. 2013-219459

(51) Int. Cl.
*H01L 29/786* (2006.01)
*H01L 29/417* (2006.01)
(Continued)

(52) U.S. Cl.
CPC .... *H01L 29/78648* (2013.01); *H01L 27/1225* (2013.01); *H01L 27/1255* (2013.01);
(Continued)

(58) Field of Classification Search
None
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1737044 A   12/2006
EP   2226847 A   9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Daniel Luke
(74) *Attorney, Agent, or Firm* — Fish & Richardson P.C.

(57) ABSTRACT

A transistor having high field-effect mobility is provided. A transistor having stable electrical characteristics is provided. A transistor having small current in an off state (in a non-conductive state) is provided. A semiconductor device including such a transistor is provided. A first electrode is formed over a substrate, a first insulating layer is formed adjacent to a side surface of the first electrode, and a second insulating layer is formed to cover the first insulating layer and be in contact with at least part of a surface of the first electrode. The surface of the first electrode is formed of a conductive material that does not easily transmit an impurity element. The second insulating layer is formed of an insulating material that does not easily transmit an impurity element. An oxide semiconductor layer is formed over the
(Continued)

first electrode with a third insulating layer provided therebetween.

14 Claims, 30 Drawing Sheets

Related U.S. Application Data continuation of application No. 14/518,259, filed on Oct. 20, 2014, now Pat. No. 9,455,349.

(51) Int. Cl.
- *H01L 29/423* (2006.01)
- *H01L 27/12* (2006.01)
- *H01L 29/49* (2006.01)
- *H01L 29/66* (2006.01)

(52) U.S. Cl.
CPC .. *H01L 29/41733* (2013.01); *H01L 29/41766* (2013.01); *H01L 29/42368* (2013.01); *H01L 29/4908* (2013.01); *H01L 29/66969* (2013.01); *H01L 29/7869* (2013.01); *H01L 29/78693* (2013.01); *H01L 29/78696* (2013.01); *H01L 2029/42388* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,421,067 B2 | 4/2013 | Yamazaki et al. |
| 8,486,773 B2 | 7/2013 | Tanaka |
| 8,547,771 B2 | 10/2013 | Koyama |
| 8,692,252 B2 | 4/2014 | Takata et al. |
| 8,981,367 B2 | 3/2015 | Yoneda et al. |
| 8,988,152 B2 | 3/2015 | Ohmaru et al. |
| 9,601,632 B2 | 3/2017 | Yamazaki et al. |
| 9,646,829 B2 | 5/2017 | Ohno et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0133191 A1 | 6/2011 | Yamazaki |
| 2011/0140100 A1 | 6/2011 | Takata et al. |
| 2012/0001335 A1 | 1/2012 | Tanaka et al. |
| 2012/0032730 A1 | 2/2012 | Koyama |
| 2012/0146713 A1 | 6/2012 | Kim et al. |
| 2012/0161125 A1 | 6/2012 | Yamazaki |
| 2013/0140569 A1 | 6/2013 | Yoneda et al. |
| 2013/0285050 A1 | 10/2013 | Yamazaki et al. |
| 2014/0042436 A1 | 2/2014 | Yamazaki |
| 2014/0131701 A1 | 5/2014 | Watanabe et al. |
| 2015/0084047 A1 | 3/2015 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |

(56) References Cited

FOREIGN PATENT DOCUMENTS

| | | |
|---|---|---|
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2011-124360 A | 6/2011 |
| JP | 2012-199530 A | 10/2012 |
| JP | 2012-257187 A | 12/2012 |
| JP | 2013-065893 A | 4/2013 |
| JP | 2013-135003 A | 7/2013 |
| JP | 2013-211839 A | 10/2013 |
| WO | WO-2004/114391 | 12/2004 |
| WO | WO-2011/013502 | 2/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID Internatioanl Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, Vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Ga-Zn-O layer
Ga-Zn-O layer
In-On layer
Ga-Zn-O layer
Ga-Zn-O layer

• In
○ Ga or Zn
• O

Ga-Zn-O layer
In-O layer
Ga-Zn-O layer 0.67 nm

In  Ga or Zn  O 0.38 nm
0.66 nm

O  Ga or Zn

FIG. 15A
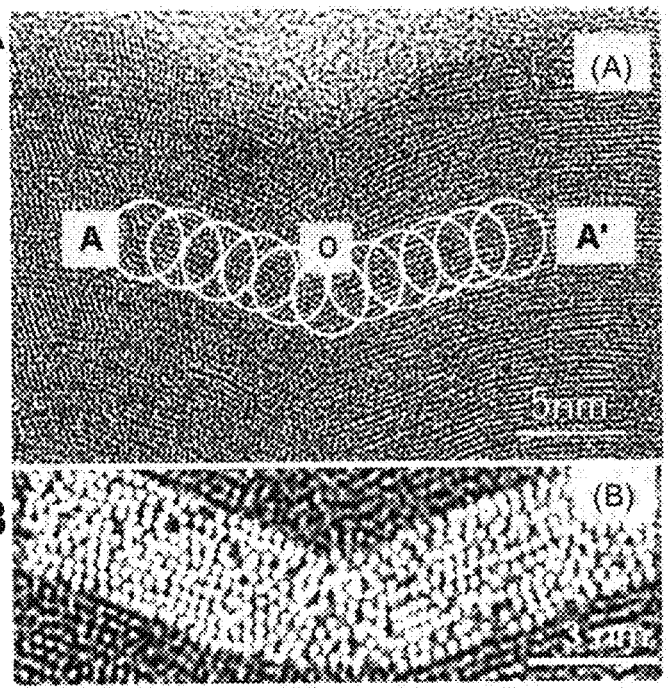
FIG. 15B
FIG. 15C
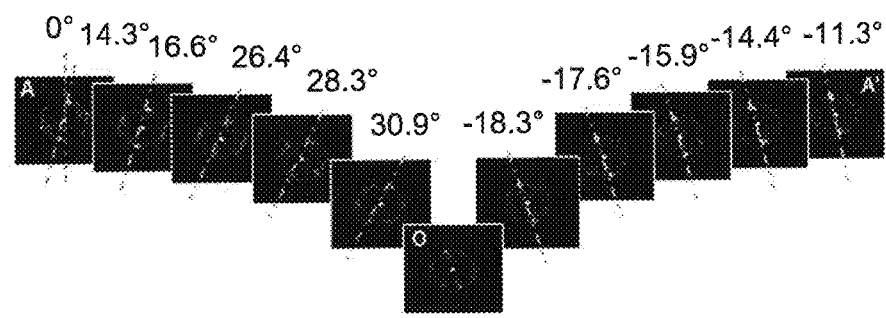

FIG. 16A
FIG. 16B
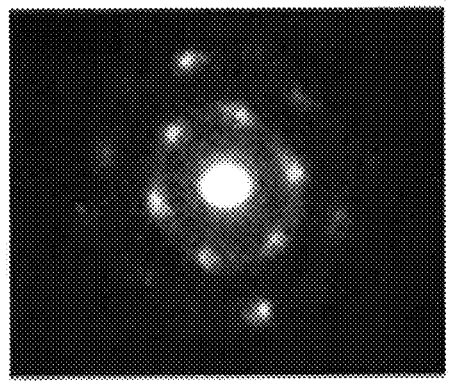
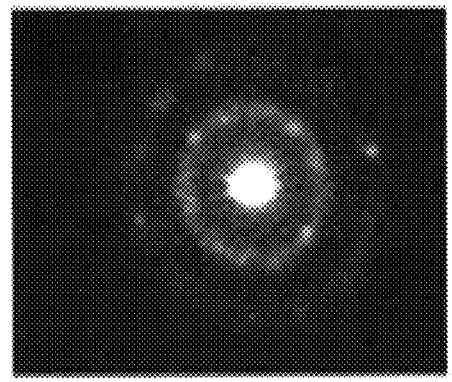
FIG. 16C
FIG. 16D
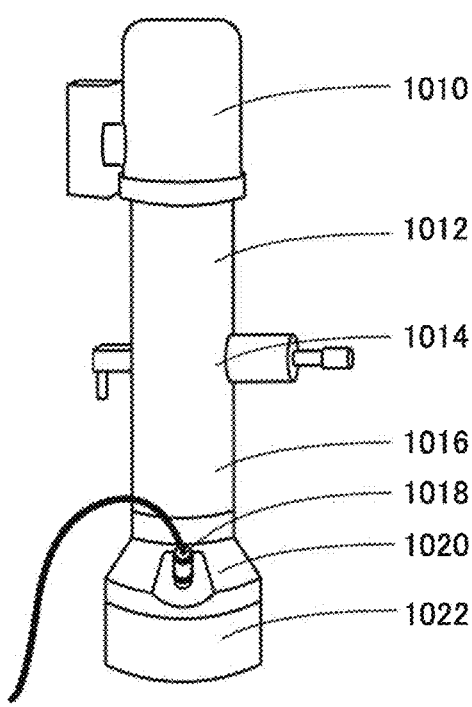
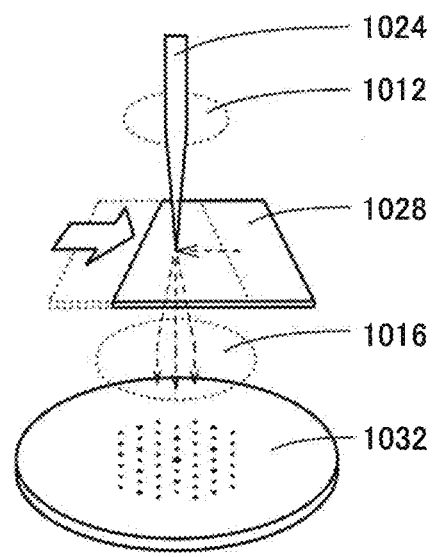

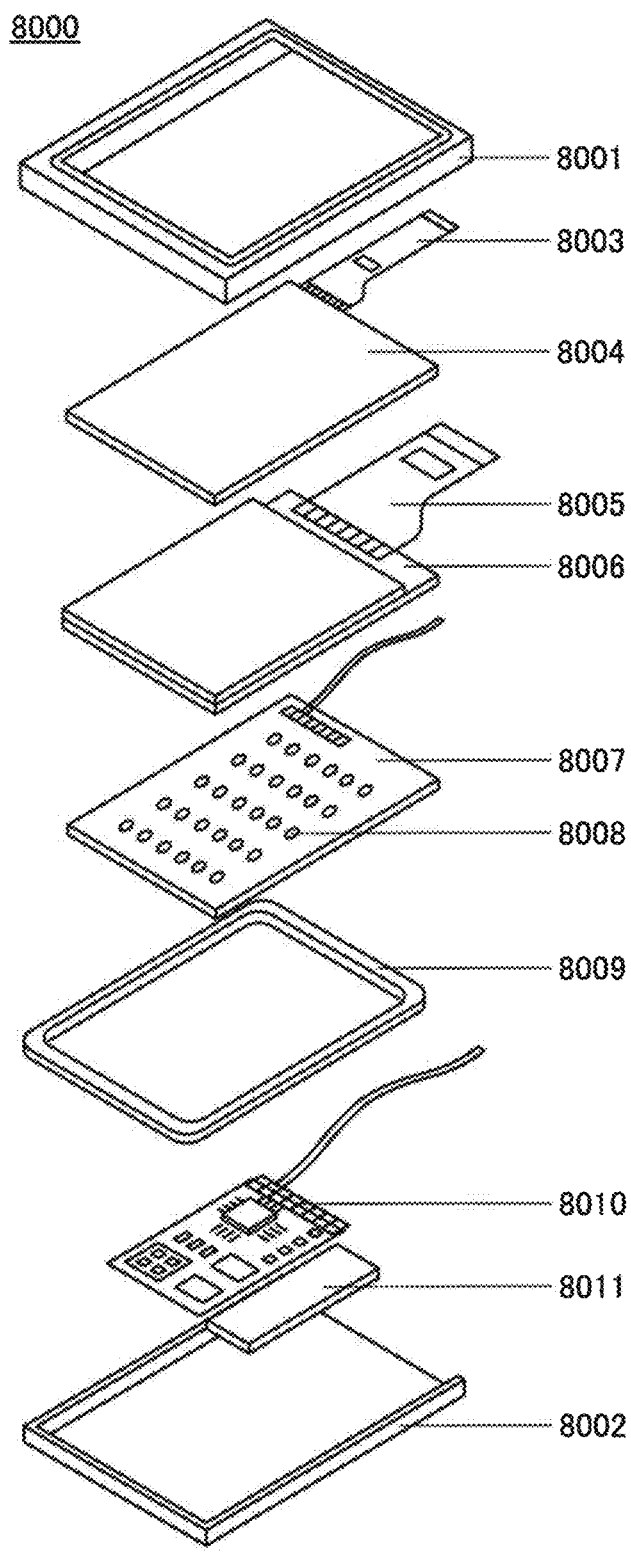

SEMICONDUCTOR DEVICE

CROSS-REFERENCE TO RELATED APPLICATIONS

This application is a continuation of U.S. application Ser. No. 15/270,064, filed Sep. 20, 2016, now allowed, which is a continuation of U.S. application Ser. No. 14/518,259, filed Oct. 20, 2014, now U.S. Pat. No. 9,455,349, which claims the benefit of a foreign priority application filed in Japan as Serial No. 2013-219459 on Oct. 22, 2013, all of which are incorporated by reference.

BACKGROUND OF THE INVENTION

1. Field of the Invention

The present invention relates to an object, a method, or a manufacturing method. Further, the present invention relates to a process, a machine, manufacture, or a composition of matter. One embodiment of the present invention relates to a semiconductor device, a display device, a light-emitting device, a lighting device, a power storage device, a memory device, a processor, or a driving method or manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

As silicon which is used as a semiconductor of a transistor, either amorphous silicon or polycrystalline silicon is used depending on the purpose For example, in the case of a transistor included in a large-sized display device, it is preferred to use amorphous silicon, which can be formed using the established technique for forming a film on a large-sized substrate. In the case of a transistor included in a high-performance display device where driver circuits are formed over the same substrate, it is preferred to use polycrystalline silicon, which can form a transistor having high field-effect mobility. As a method for forming polycrystalline silicon, high-temperature heat treatment or laser light treatment which is performed on amorphous silicon is known.

In recent years, an oxide semiconductor has attracted attention. For example, a transistor which includes an amorphous oxide semiconductor containing indium, gallium, and zinc is disclosed (see Patent Document 1).

An oxide semiconductor can be formed by a sputtering method or the like, and thus can be used for a channel formation region of a transistor in a large display device. A transistor including an oxide semiconductor has high field-effect mobility; therefore, a high-performance display device where driver circuits are formed over the same substrate can be obtained. In addition, there is an advantage that capital investment can be reduced because part of production equipment for a transistor including amorphous silicon can be retrofitted and utilized.

A transistor including an oxide semiconductor is known to have extremely small leakage current in an off state. For example, a low-power-consumption CPU utilizing such a small leakage current characteristic of a transistor including an oxide semiconductor is disclosed (see Patent Document 2).

REFERENCE

Patent Document

[Patent Document 1] Japanese Published Patent Application No. 2006-165528
[Patent Document 2] Japanese Published Patent Application No. 2012-257187

SUMMARY OF THE INVENTION

An object is to provide a transistor having high field-effect mobility. Another object is to provide a transistor having stable electrical characteristics. Another object is to provide a transistor having small current in an off state (in a non-conductive state). Another object is to provide a transistor with low power consumption. Another object is to provide a transistor with high reliability. Another object is to provide a novel transistor.

An object is to provide a semiconductor device that occupies a small area. Another object is to provide a highly integrated semiconductor device. Another object is to provide a highly reliable semiconductor device. Another object is to provide a novel semiconductor device.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

An embodiment of the present invention is a semiconductor device including a first electrode, a first insulating layer, a second insulating layer, a third insulating layer, and an oxide semiconductor layer. In the semiconductor device, the first insulating layer is adjacent to a side surface of the first electrode. The second insulating layer covers the first insulating layer and is in contact with at least part of a surface of the first electrode. The first electrode overlaps with the oxide semiconductor layer with the third insulating layer sandwiched between the first electrode and the oxide semiconductor layer. The second insulating layer is an insulating material that does not easily transmit an impurity element. The surface of the first electrode is a conductive material that does not easily transmit an impurity element.

Another embodiment of the present invention is a semiconductor device including a first gate electrode, a second gate electrode, a first gate insulating layer, a second gate insulating layer, an oxide semiconductor layer, a source electrode, a drain electrode, a first insulating layer, and a second insulating layer. In the semiconductor device, the oxide semiconductor layer is sandwiched between the first gate insulating layer and the second gate insulating layer. The first gate insulating layer, the oxide semiconductor layer, and the second gate insulating layer are sandwiched between the first gate electrode and the second gate electrode. The source electrode and the drain electrode are in contact with the oxide semiconductor layer. The first insulating layer is adjacent to a side surface of the second gate electrode. The second insulating layer covers the first insulating layer and is in contact with at least part of a surface of the second gate electrode. The second insulating layer is an insulating material that does not easily transmit an impurity element. The surface of the second gate electrode is a conductive material that does not easily transmit an impurity element.

The second insulating layer is formed using aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, or tantalum oxide.

The surface of the first electrode and the surface of the second gate electrode are formed using a conductive material such as indium tin oxide (hereinafter also referred to as "ITO"), indium tin oxide containing silicon, phosphorus, boron, nitrogen, and/or carbon, indium gallium zinc oxide containing silicon, phosphorus, boron, nitrogen, and/or carbon, tantalum nitride or ruthenium.

A semiconductor device that occupies a small area can be provided. Further, a highly integrated semiconductor device can be provided. Further, a highly reliable semiconductor device can be provided. A novel semiconductor device can be provided.

Note that the descriptions of these effects do not disturb the existence of other effects. One embodiment of the present invention does not necessarily achieve all of these effects. Other effects will be apparent from and can be derived from the description of the specification, the drawings, the claims, and the like.

BRIEF DESCRIPTION OF THE DRAWINGS

In the accompanying drawings:

FIGS. 15A to 15C are cross-sectional TEM images and local Fourier transform images of an oxide semiconductor;

FIGS. 16A and 16B show nanobeam electron diffraction patterns of oxide semiconductor films and FIGS. 16C and 16D illustrate an example of a transmission electron diffraction measurement apparatus;

FIG. 25 illustrates a display module;

DETAILED DESCRIPTION OF THE INVENTION

Figure 1A:
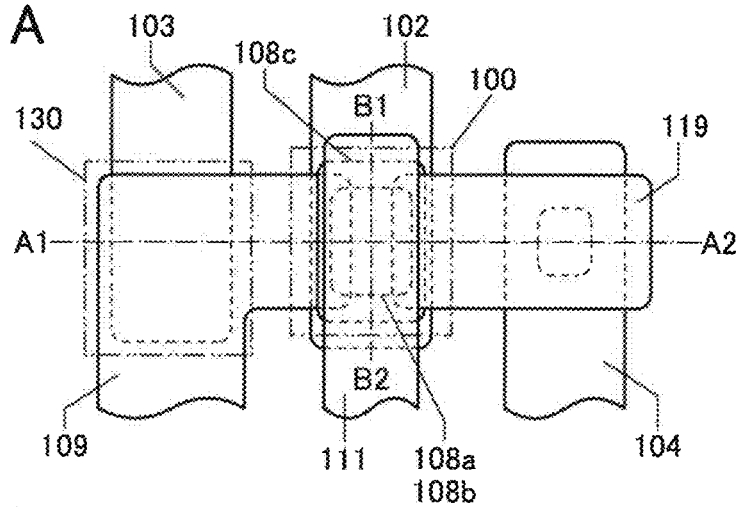
FIGS. 1A to 1C illustrate an example of a transistor and a capacitor according to one embodiment of the present invention.

Embodiments will be described in detail with reference to drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

The position, size, range, and the like of each component illustrated in the drawings and the like are not accurately represented in some cases to facilitate understanding of the invention. Therefore, the disclosed invention is not necessarily limited to the position, the size, the range, or the like disclosed in the drawings and the like. For example, in the actual manufacturing process, a resist mask or the like might be unintentionally reduced in size by treatment such as etching, which is not illustrated in some cases for easy understanding.

Especially in a top view (also referred to as a plan view), some components might not be illustrated for easy understanding.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

Note that the term "over" or "under" in this specification and the like does not necessarily mean that a component is placed "directly on and directly in contact with" another component or "directly below and directly in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having opposite polarity is employed or the direction of current flow is changed in circuit operation. Thus, it is difficult to define which is a source or a drain. Accordingly, the terms "source" and "drain" can be switched in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Accordingly, even when the expression "electrically connected" is used in this specification, there is a case in which no physical connection is made and a wiring is just extended in an actual circuit.

In this specification, a term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, a term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, the trigonal and rhombohedral crystal systems are included in the hexagonal crystal system.

In this specification, in the case where an etching step is performed after a photolithography process, a resist mask formed in the photolithography process is removed after the etching step, unless otherwise specified.

A voltage usually refers to a potential difference between a given potential and a reference potential (e.g., a source potential or a ground potential (GND)). A voltage can be referred to as a potential and vice versa.

Note that a "semiconductor" may have characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" may have characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) in a semiconductor may be increased, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. Further, in the case where the semiconductor is a silicon film, examples of an impurity which changes characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

In view of the above, in a top view of a transistor, an apparent channel width that is a length of a portion where a source and a drain face each other in a region where a semiconductor and a gate electrode overlap with each other may be referred to as a "surrounded channel width (SCW)" in this specification. Further, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Embodiment 1

In this embodiment, a structure example of a transistor 100 of one embodiment of the present invention will be described with reference to drawings.

<A: Structure Example of Transistor and Capacitor>

Figure 1B:
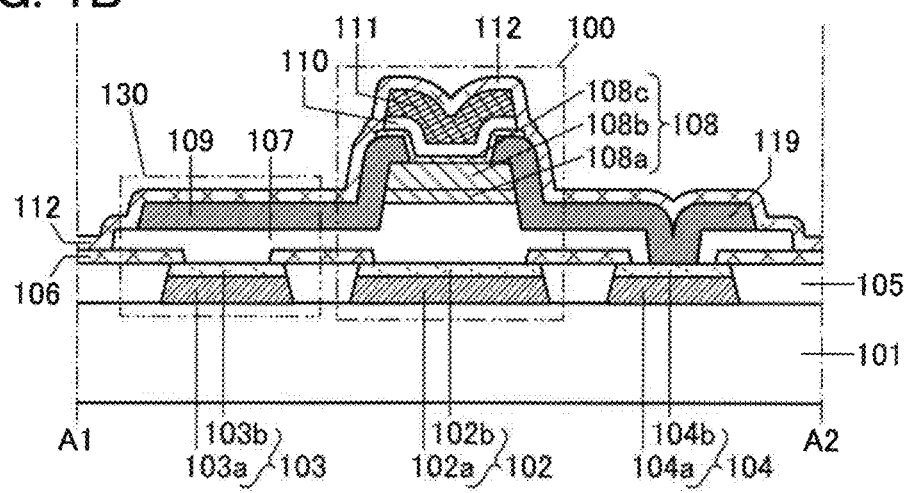
Figure 1C:
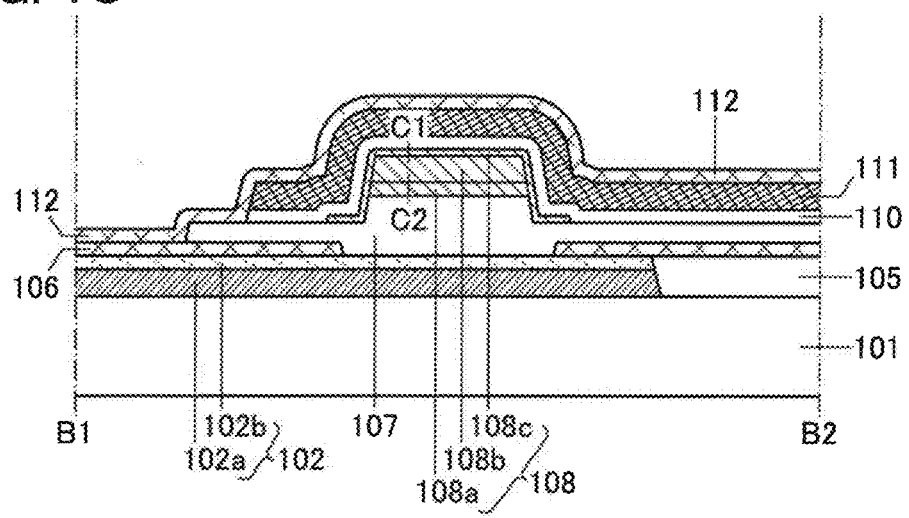

FIG. 1A is a top view of the transistor 100 and a capacitor 130. FIG. 1B is a cross-sectional view taken along dashed-dotted line A1-A2 in FIG. 1A. FIG. 1C is a cross-sectional view taken along dashed-dotted line B1-B2 in FIG. 1A.

The transistor 100 illustrated in FIGS. 1A to 1C is formed over a substrate 101. The transistor 100 includes an electrode 102, an insulating layer 106, an insulating layer 107, an oxide semiconductor layer 108, an electrode 109, an electrode 119, an insulating layer 110, an electrode 111, and an insulating layer 112. An electrode 103 and an electrode 104 are also illustrated in FIGS. 1A and 1B.

Specifically, the electrode 102, the electrode 103, and the electrode 104 are formed over the substrate 101, and an insulating layer 105 is formed in a space between the electrodes. The electrode 102 has a structure in which an electrode 102b is stacked over an electrode 102a. The electrode 103 has a structure in which an electrode 103b is stacked over an electrode 103a. The electrode 104 has a structure in which an electrode 104b is stacked over an electrode 104a. The insulating layer 106 is formed over the insulating layer 105 and in contact with part of the electrode 102b, part of the electrode 103b, and part of the electrode 104b.

The insulating layer 107 is formed over the insulating layer 106 and in contact with part of the electrode 102b, part of the electrode 103b, and part of the electrode 104b. The insulating layer 107 has a projection. Over the projection, an oxide semiconductor layer 108a and an oxide semiconductor layer 108b are formed. The electrode 109 and the electrode 119 are formed in contact with the oxide semiconductor layer 108b. The electrode 119 is electrically connected to the electrode 104 through an opening formed in the insulating layer 107.

An oxide semiconductor layer 108c is formed in contact with the oxide semiconductor layer 108b, the electrode 109, and the electrode 119. In FIGS. 1A to 1C, the oxide semiconductor layer 108a, the oxide semiconductor layer 108b, and the oxide semiconductor layer 108c are collectively represented by the oxide semiconductor layer 108.

The insulating layer 110 is formed over the oxide semiconductor layer 108c, and the electrode 111 is formed over the insulating layer 110. The insulating layer 112 is formed to cover the electrode 109, the electrode 119, and the electrode 111.

The electrode 111 can function as a gate electrode. The insulating layer 110 can function as a gate insulating layer. The electrode 109 can function as one of a source electrode and a drain electrode. The electrode 119 can function as the other of the source electrode and the drain electrode. The electrode 102 can function as a back gate electrode. The transistor 100 is a transistor that includes an oxide semiconductor in a semiconductor layer in which a channel is formed. The transistor 100 is a form of top-gate transistor.

Here, a back gate electrode will be described. In general, the back gate electrode is formed using a conductive layer and positioned so that the channel formation region of the semiconductor layer is positioned between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode independently of the potential of the gate electrode, the threshold voltage of the transistor can be changed.

The electrode 111 and the electrode 102 included in the transistor 100 can both function as a gate electrode. Thus, the insulating layer 110 and the insulating layer 107 can both function as a gate insulating layer. In the case where one of the electrode 111 and the electrode 102 is simply referred to as a "gate electrode", the other may be referred to as a "back gate electrode". Alternatively, one of the electrode 111 and the electrode 102 may be referred to as a "first gate electrode", and the other may be referred to as a "second gate electrode". In the case where the electrode 102 is used as a "gate electrode", the transistor 100 is a form of bottom-gate transistor.

By providing the electrode 111 and the electrode 102 so that the oxide semiconductor layer 108 is located therebetween, and by setting the potentials of the electrode 111 and the electrode 102 to be the same, a region of the oxide semiconductor layer 108 through which carriers flow is enlarged in the film thickness direction; thus, the number of transferred carriers is increased. As a result, the on-state current and field-effect mobility of the transistor 100 are increased.

Therefore, the transistor 100 has large on-state current for its area. That is, the area occupied by the transistor 100 can be small for required on-state current. With one embodiment of the present invention, the area occupied by a transistor can be reduced. Therefore, with one embodiment of the present invention, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, a function of blocking static electricity).

Since the electrode 111 and the electrode 102 each have a function of blocking an electric field from an outside, charges of charged particles and the like provided on the substrate 101 side or the electrode 111 side do not influence the oxide semiconductor layer 108. Therefore, degradation in a stress test (e.g., a negative gate bias temperature (−GBT) stress test in which negative charges are applied to a gate) can be reduced, and changes in the rising voltages of on-state current at different drain voltages can be reduced. Note that this effect is caused when the electrodes 111 and 102 have the same potential or different potentials.

The BT stress test is one kind of accelerated test and can evaluate, in a short time, a change by long-term use (i.e., a change over time) in characteristics of transistors. In particular, the amount of change in threshold voltage of the transistor between before and after the BT stress test is an important indicator when examining the reliability of the transistor. As the amount of change in the threshold voltage between before and after the BT stress test is smaller, the transistor has higher reliability.

By providing the electrode 111 and the electrode 102 and setting the potentials of the electrode 111 and the electrode 102 to be the same, the amount of change in threshold voltage between before and after the BT stress test is reduced. Accordingly, variation in electrical characteristics among a plurality of transistors is also reduced.

The transistor 100 including the back gate electrode has a small amount of change in threshold voltage between before and after a +GBT stress test in which positive charges are applied to a gate.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

Next, the "threshold voltage" is described. The electrode 111 is used as a gate electrode. When a voltage is applied to the electrode 111, an electric field with an intensity corresponding to the applied voltage is applied to the oxide semiconductor layer 108 through the insulating layer 110, so that carriers are generated and a channel is formed in the oxide semiconductor layer 108. When the channel is formed, the electrode 109 is electrically connected to the electrode 119 and the transistor is turned on (in an on state). The voltage of the electrode 111 at which the channel begins to be formed in the oxide semiconductor layer 108 is referred to as a "threshold voltage".

In the case where the transistor 100 is an n-channel transistor and the electrode 109 and the electrode 119 are used as a source electrode and a drain electrode respectively, when the potential of the electrode 109 is set to 0 V and a voltage higher than or equal to the threshold voltage is applied to the electrode 111, carriers are supplied from the electrode 109 to the oxide semiconductor layer 108 to form the channel. In general, a region of the semiconductor layer where the channel is formed is referred to as a "channel formation region". At this time, by application of a positive voltage to the electrode 119, carriers flow from the electrode 109 to the electrode 119. In other words, a current flows from the electrode 119 to the electrode 109. Note that a current flowing between the source electrode and the drain electrode when the transistor is in an on state is referred to as an "on-state current". A current flowing between the source electrode and the drain electrode when the transistor is in an off state is referred to as an "off-state current".

The insulating layer 106 and the insulating layer 112 are preferably formed using an insulating material that does not easily transmit oxygen and impurities such as hydrogen, water, an alkali metal, and an alkaline earth metal. By forming the insulating layer 106 and the insulating layer 112 with such a material, diffusion of impurities to the oxide semiconductor layer 108 from the outside can be prevented. In addition, diffusion of oxygen included in the oxide semiconductor layer 108 to the outside can be prevented.

Further, the insulating layer 106 is preferably not provided over at least part of the electrode 102. By not providing the insulating layer 106 over at least part of the electrode 102, the distance between the electrode 102 and the oxide semiconductor layer 108 can be shortened by the thickness of the insulating layer 106. Thus, the electric field intensity applied to the oxide semiconductor layer 108 by the electrode 102 can be high. Therefore, the function of the electrode 102 as a gate electrode or a back gate electrode can be more effective.

The electrode 103, the electrode 109, and the insulating layer 107 provided therebetween as a dielectric constitute the capacitor 130. Although the insulating layer 106 on the electrode 103 is removed in this embodiment, the insulating layer 106 on the electrode 103 may be kept unremoved and the stacked insulating layers 106 and 107 may be used as a dielectric.

It is preferable that the insulating layer 106 be in contact with the insulating layer 112 at the outside of the transistor 100. In FIG. 1B, a region where the insulating layer 106 is in contact with the insulating layer 112 is illustrated at both ends of the drawing. This structure can enhance the effect of preventing diffusion of impurities to the oxide semiconductor layer 108 from the outside. In addition, this structure can enhance the effect of preventing diffusion of oxygen included in the oxide semiconductor layer 108 to the outside. With one embodiment of the present invention, a highly reliable semiconductor device can be provided.

[A-1: Substrate 101]

Although there is no particular limitation on a material that can be used as the substrate 101, it is necessary that the substrate have at least heat resistance high enough to withstand heat treatment to be performed later. For example, a glass substrate of barium borosilicate glass, aluminoborosilicate glass, or the like, a ceramic substrate, a quartz substrate, or a sapphire substrate can be used.

A single crystal semiconductor substrate or a polycrystalline semiconductor substrate of silicon, silicon carbide, or the like or a compound semiconductor substrate of silicon germanium or the like may be used as the substrate 101. Alternatively, an SOI substrate, a semiconductor substrate over which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like which can be used for a high-electron-mobility transistor (HEMT) may be used. By using any of these semiconductors, a transistor capable of high speed operation can be obtained. The substrate 101 is not limited to a simple supporting substrate, and may be a substrate where a device such as a transistor is formed; in this case, at least one of the gate electrode, the source electrode, and the drain electrode of the transistor 100 may be electrically connected to the device.

Note that a flexible substrate may also be used as the substrate 101. In the case where a flexible substrate is used, the transistor, the capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

[A-2: Electrodes 102a, 103a and 104a]

As a conductive material for forming the electrode 102a, the electrode 103a, and the electrode 104a, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; or the like can be used. Alternatively, a semiconductor having a high electric conductivity typified by polycrystalline silicon including an impurity element such as phosphorus, or silicide such as nickel silicide may be used. There is no particular limitation on a formation method of the conductive layer, and a variety of formation methods such as an evaporation method, a CVD method, a sputtering method, and a spin coating method can be employed.

Note that the CVD method can be generally classified into a plasma enhanced CVD (PECVD) method using plasma, a thermal CVD (TCVD) method using heat, and the like. The CVD method can be further classified into a metal CVD (MCVD) method and a metal organic CVD (MOCVD) method according to a source gas to be used.

Furthermore, the evaporation method can be generally classified into a resistance heating evaporation method, an electron beam evaporation method, a molecular beam epitaxy (MBE) method, a pulsed laser deposition (PLD) method, an ion beam assisted deposition (IAD) method, an atomic layer deposition (ALD) method, and the like.

By using the PECVD method, a high-quality film can be formed at a relatively low temperature. By using a deposition method that does not use plasma for deposition, such as the MOCVD method or the evaporation method, a film can be formed with few defects because damage is not easily caused on a surface on which the film is deposited.

The electrode 102a, the electrode 103a, and the electrode 104a can also be formed using a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added, or a conductive material containing nitrogen, such as titanium nitride or tantalum nitride. It is also possible to use a stacked-layer structure formed using a material containing the above metal element and the above conductive material containing oxygen. It is also possible to use a stacked-layer structure formed using a material containing the above metal element and the above conductive material containing nitrogen. It is also possible to use a stacked-layer structure formed using a material containing the above metal element, the above conductive material containing oxygen, and the above conductive material containing nitrogen.

The electrode 102a, the electrode 103a, and the electrode 104a may have a single-layer structure or a stacked-layer structure of two or more layers. For example, there are a single-layer structure of an aluminum layer containing silicon; a two-layer structure in which a titanium layer is stacked over an aluminum layer; a two-layer structure in which a titanium layer is stacked over a titanium nitride layer; a two-layer structure in which a tungsten layer is stacked over a titanium nitride layer; a two-layer structure in which a tungsten layer is stacked over a tantalum nitride layer; and a three-layer structure in which a titanium layer, an aluminum layer, and a titanium layer are stacked in that order. Alternatively, a layer, an alloy layer, or a nitride layer which contains aluminum and one or more elements selected from titanium, tantalum, tungsten, molybdenum, chromium, neodymium, and scandium may be used.

The thickness of the electrode 102a, the electrode 103a, and the electrode 104a may be greater than or equal to 10 nm and less than or equal to 500 nm, and is preferably greater than or equal to 50 nm and less than or equal to 300 nm.

[A-3: Electrodes 102b, 103b and 104b]

The electrode 102b, the electrode 103b, and the electrode 104b are preferably formed using a conductive material that does not easily transmit oxygen and impurities such as hydrogen, water, an alkali metal, and an alkaline earth metal. Examples of such a conductive material include indium tin oxide, indium tin oxide containing silicon, phosphorus, boron, nitrogen and/or carbon, indium gallium zinc oxide containing silicon, phosphorus, boron, nitrogen and/or carbon, tantalum nitride, and ruthenium. The electrode 102b, the electrode 103b, and the electrode 104b may have a single-layer structure or a stacked-layer structure of two or more layers.

The thickness of the electrode 102b, the electrode 103b, and the electrode 104b may be greater than or equal to 10 nm and less than or equal to 500 nm, and is preferably greater than or equal to 50 nm and less than or equal to 300 nm.

Note that the electrode 102, the electrode 103, and the electrode 104 may be formed of only the electrode 102b, the electrode 103b, and the electrode 104b, respectively, without including the electrode 102a, the electrode 103a, and the electrode 104a.

[A-4: Insulating Layer 105]

The insulating layer 105 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, and tantalum oxide. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

In the case where the insulating layer 105 is a stacked layer including a plurality of layers, the stacked layer may include a silicon nitride layer as a first layer and a silicon oxide layer as a second layer. In that case, the silicon oxide layer may be a silicon oxynitride layer. In addition, the silicon nitride layer may be a silicon nitride oxide layer.

The thickness of the insulating layer 105 may be greater than or equal to 10 nm and less than or equal to 500 nm, and is preferably greater than or equal to 50 nm and less than or equal to 300 nm.

[A-5: Insulating Layer 106]

The insulating layer 106 is preferably formed using an insulating material that does not easily transmit oxygen and impurities such as hydrogen, water, an alkali metal, and an alkaline earth metal. Examples of such an insulating material include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, and tantalum oxide.

The thickness of the insulating layer 106 may be greater than or equal to 10 nm and less than or equal to 500 nm, and is preferably greater than or equal to 50 nm and less than or equal to 300 nm.

[A-6: Insulating Layer 107]

The insulating layer 107 can be formed using a material and a method that are similar to those of the insulating layer 105. The hydrogen concentration in the insulating layer 107 is preferably low in order to prevent an increase in the hydrogen concentration in the oxide semiconductor. Specifically, the hydrogen concentration in the insulating layer 107, which is measured by SIMS, is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. Furthermore, the nitrogen concentration in the insulating layer 107 is preferably low in order to prevent an increase in the nitrogen concentration in the oxide semiconductor. Specifically, the nitrogen concentration in the insulating layer 107, which is measured by SIMS, is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The insulating layer 107 is preferably formed using an insulating layer containing oxygen at a higher proportion than oxygen in the stoichiometric composition. From the insulating layer containing oxygen at a higher proportion than oxygen in the stoichiometric composition, part of oxygen is released by heating. The insulating layer containing oxygen at a higher proportion than oxygen in the stoichiometric composition is an insulating layer of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

The thickness of the insulating layer 106 may be greater than or equal to 10 nm and less than or equal to 500 nm, and is preferably greater than or equal to 50 nm and less than or equal to 300 nm.

[A-7: Oxide Semiconductor Layer 108]

The oxide semiconductor layer 108 has a structure in which the oxide semiconductor layer 108a, the oxide semiconductor layer 108b, and the oxide semiconductor layer 108c are stacked.

The oxide semiconductor layer 108a, the oxide semiconductor layer 108b, and the oxide semiconductor layer 108c are each formed using a material containing one or both of indium and gallium. Typical examples are an In—Ga oxide (an oxide containing In and Ga), an In—Zn oxide (an oxide containing In and Zn), and an In-M-Zn oxide (an oxide containing In, an element M, and Zn).

The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element that can increase the energy gap of the oxide, for example. The oxide semiconductor layer 108 is preferably an oxide semiconductor containing the element M. Further, the oxide semiconductor preferably contains zinc. When the oxide contains zinc, the oxide is easily crystallized, for example.

Note that the oxide semiconductor is not limited to the oxide containing indium. The oxide semiconductor may be, for example, zinc tin oxide or gallium tin oxide.

The oxide semiconductor layer 108 can be formed by a sputtering method, a chemical vapor deposition (CVD) method (including but not limited to a metal organic chemical vapor deposition (MOCVD) method, an atomic layer deposition (ALD) method, a thermal CVD method, or a plasma enhanced chemical vapor deposition (PECVD) method), a molecular beam epitaxy (MBE) method, or a pulsed laser deposition (PLD) method. In particular, an MOCVD method, an ALD method, or a thermal CVD method is preferably used, in which case the oxide semiconductor layer 108 is hardly damaged since plasma is not used, so that the leakage current in the off state of the transistor can be kept low.

For example, in the case where an InGaZnO$_X$ (X>0) film is formed by a thermal CVD method as the oxide semiconductor layer 108, trimethylindium, trimethylgallium, and dimethylzinc are used. Note that the chemical formula of trimethylindium is In(CH$_3$)$_3$. The chemical formula of trimethylgallium is Ga(CH$_3$)$_3$. The chemical formula of dimethylzinc is Zn(CH$_3$)$_2$. Without limitation to the above combination, triethylgallium (chemical formula: Ga(C$_2$H$_5$)$_3$) can be used instead of trimethylgallium and diethylzinc (chemical formula: Zn(C$_2$H$_5$)$_2$) can be used instead of dimethylzinc.

For example, in the case where an InGaZnO$_X$ (X>0) film is formed by an ALD method as the oxide semiconductor layer 108, an In(CH$_3$)$_3$ gas and an O$_3$ gas are sequentially introduced a plurality of times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaInO layer, a ZnInO layer or a GaZnO layer may be formed by mixing of these gases. Note that although an H$_2$O gas which is bubbled with an inert gas such as Ar may be used instead of an O$_3$ gas, it is preferable to use an O$_3$ gas which does not contain H. Further, instead of an In(CH$_3$)$_3$ gas, an In(C$_2$H$_5$)$_3$ gas or tris(acetylacetonato)indium may be used. Note that tris(acetylacetonato)indium is also referred to as In (acac)$_3$. In addition, instead of a Ga(CH$_3$)$_3$ gas, a Ga(C$_2$H$_5$)$_3$ gas or tris(acetylacetonato)gallium may be used. Note that tris(acetylacetonato)gallium is also referred to as Ga(acac)$_3$. Further, instead of an In(CH$_3$)$_3$ gas, an In(C$_2$H$_5$)$_3$ gas may be used. Furthermore, a Zn(CH$_3$)$_2$ gas or zinc acetate may be used. However, the deposition gas is not limited to these.

In the case where the oxide semiconductor layer 108 is formed by a sputtering method, a target containing indium is preferably used in order to reduce the number of particles. In addition, if an oxide target having a high atomic ratio of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

In the case where the oxide semiconductor layer 108 is formed by a sputtering method, the atomic ratio of In to M and Zn contained in the target may be 3:1:1, 3:1:2, 3:1:4, 1:1:0.5, 1:1:1, 1:1:2, or 1:4:4, for example.

In the cases where the oxide semiconductor layer 108 is formed by a sputtering method, a film having an atomic ratio different from the atomic ratio of the target may be formed. Especially for zinc, the atomic ratio of zinc in a deposited film is smaller than the atomic ratio of the target in some cases. Specifically, the film has an atomic ratio of zinc of 40 atomic % to 90 atomic % of the atomic ratio of zinc in the target.

The oxide semiconductor layer 108a and the oxide semiconductor layer 108c are preferably formed using a material including one or more kinds of metal elements included in the oxide semiconductor layer 108b. With the use of such a material, interface states at interfaces between the oxide semiconductor layer 108a and the oxide semiconductor layer 108b and between the oxide semiconductor layer 108c and the oxide semiconductor layer 108b are less likely to be generated. Accordingly, carriers are not likely to be scattered or captured at the interfaces, which results in an improvement in field-effect mobility of the transistor. Further, variation in threshold voltage of the transistor can be reduced. Thus, a semiconductor device having favorable electrical characteristics can be obtained.

The thicknesses of the oxide semiconductor layer 108a and the oxide semiconductor layer 108c are each greater than or equal to 3 nm and less than or equal to 100 nm, preferably greater than or equal to 3 nm and less than or equal to 50 nm. The thickness of the oxide semiconductor layer 108b is greater than or equal to 3 nm and less than or equal to 200 nm, preferably greater than or equal to 3 nm and less than or equal to 100 nm, further preferably greater than or equal to 3 nm and less than or equal to 50 nm.

When the oxide semiconductor layer 108b is an In-M-Zn oxide containing In, M, and Zn at an atomic ratio of $x_2$:$y_2$:$z_2$ and each of the oxide semiconductor layer 108a and the oxide semiconductor layer 108c is an In-M-Zn oxide containing In, M, and Zn at an atomic ratio of $x_1$:$y_1$:$z_1$, $y_1/x_1$ needs to be larger than $y_2/x_2$. Preferably, the oxide semiconductor layer 108a, the oxide semiconductor layer 108c, and the oxide semiconductor layer 108b in which $y_1/x_1$ is 1.5 times or more as large as $y_2/x_2$ are selected. Still further preferably, the oxide semiconductor layer 108a, the oxide semiconductor layer 108c, and the oxide semiconductor layer 108b in which $y_1/x_1$ is 2 times or more as large as $y_2/x_2$ are selected. Still further preferably, the oxide semiconductor layer 108a, the oxide semiconductor layer 108c, and the oxide semiconductor layer 108b in which $y_1/x_1$ is 3 times or more as large as $y_2/x_2$ are selected. In the oxide semiconductor layer 108b at this time, $y_1$ is preferably larger than or equal to $x_1$ because the transistor can have stable electrical characteristics. However, when $y_1$ is three times or more as large as $x_1$, the field-effect mobility of the transistor is reduced; accordingly, $y_1$ is preferably smaller than three times $x_1$. When the oxide semiconductor layers 108a and 108c each have the above structure, each of the oxide semiconductor layers 108a and 108c can be a layer in which oxygen vacancy is less likely to occur than in the oxide semiconductor layer 108b.

In the case of using an In-M-Zn oxide as the oxide semiconductor layers 108a and 108c, when summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. In the case of using an In-M-Zn oxide as the oxide semiconductor layer 108b, when summation of In and M is assumed to be 100 atomic %, the proportions of In and M are preferably set to be greater than or equal to 25 atomic % and less than 75 atomic %, respectively, further preferably greater than or equal to 34 atomic % and less than 66 atomic %, respectively.

For example, an In—Ga—Zn oxide which is formed using a target having an atomic ratio of In:Ga:Zn=1:3:2, 1:3:4, 1:3:6, 1:6:4, or 1:9:6 or an In—Ga oxide which is formed using a target having an atomic ratio of In:Ga=1:9 or 7:93 can be used for each of the oxide semiconductor layers 108a and 108c containing In or Ga. Further, an In—Ga—Zn oxide which is formed using a target having an atomic ratio of In:Ga:Zn=1:1:1 or 3:1:2 can be used for the oxide semiconductor layer 108b. In each of the oxide semiconductor layers 108a, 108b, and 108c, the proportions of the atoms in the above atomic ratio vary within a range of ±20% as an error.

In order to give stable electrical characteristics to the transistor including the oxide semiconductor layer 108, it is preferable that impurities and oxygen vacancies in the oxide semiconductor layer 108 be reduced to highly purify the oxide semiconductor layer 108 so that the oxide semiconductor layer 108 can be regarded as an intrinsic or substantially intrinsic semiconductor layer. Furthermore, it is preferable that at least the channel formation region of the oxide semiconductor layer 108 be regarded as an intrinsic or substantially intrinsic semiconductor layer.

Note that the substantially intrinsic semiconductor layer refers to an oxide semiconductor layer in which the carrier density is lower than $1\times10^{17}$/cm$^3$, lower than $1\times10^{15}$/cm$^3$, or lower than $1\times10^{13}$/cm$^3$.

Figure 6:
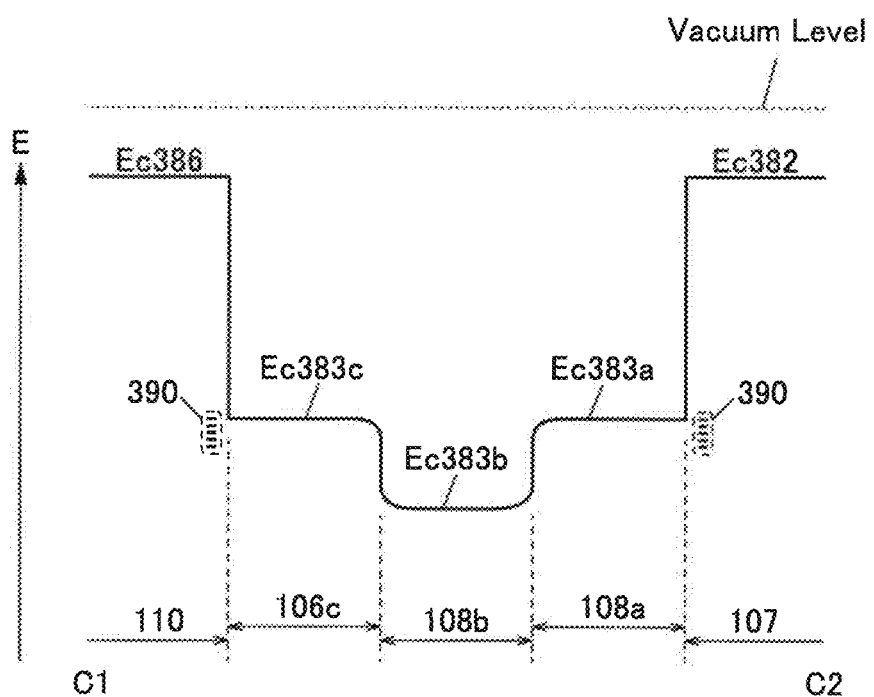
FIG. 6 shows an energy band structure.

A function and an effect of the oxide semiconductor layer 108 consisting of the oxide semiconductor layers 108a, 108b, and 108c are described using an energy band structure diagram of FIG. 6. FIG. 6 illustrates the energy band structure of a portion along a dashed dotted line C1-C2 in FIG. 1C. FIG. 6 illustrates the energy band structure of a channel formation region of the transistor 100.

In FIG. 6, Ec382, Ec383a, Ec383b, Ec383c, and Ec386 are the energies of the conduction band minimum in the insulating layer 107, the oxide semiconductor layer 108a, the oxide semiconductor layer 108b, the oxide semiconductor layer 108c, and the insulating layer 110, respectively.

Here, a difference in energy between the vacuum level and the conduction band minimum (this difference is also referred to as "electron affinity") corresponds to a value obtained by subtracting an energy gap from a difference in energy between the vacuum level and the valence band maximum (this difference is also referred to as an "ionization potential"). Note that the energy gap can be measured using a spectroscopic ellipsometer (UT-300 manufactured by HORIBA JOBIN YVON SAS.). Further, the difference in energy between the vacuum level and the top of the valence band can be measured using an ultraviolet photoelectron spectroscopy (UPS) device (VersaProbe manufactured by ULVAC-PHI, Inc.).

Note that an In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV.

Since the insulating layer 107 and the insulating layer 110 are insulators, Ec382 and Ec386 are closer to the vacuum level (have a smaller electron affinity) than Ec383a, Ec383b, and Ec383c.

Furthermore, Ec383a is closer to the vacuum level than Ec383b. Specifically, Ec383a is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Furthermore, Ec383c is closer to the vacuum level than Ec383b. Specifically, Ec383c is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

In the vicinity of the interface between the oxide semiconductor layers 108a and 108b and the vicinity of the interface between the oxide semiconductor layers 108b and 108c, mixed regions are formed; thus, the energy of the conduction band minimum continuously changes. In other words, no state or few states exist at these interfaces.

Accordingly, electrons transfer mainly through the oxide semiconductor layer 108b in the stacked-layer structure having the above energy band structure. Therefore, even when an interface state exists at an interface between the oxide semiconductor layer 108a and the insulating layer 107 or an interface between the oxide semiconductor layer 108c and the insulating layer 110, the interface state hardly influences the transfer of the electrons. In addition, since no interface state or few interface states exist at an interface between the oxide semiconductor layer 108a and the oxide semiconductor layer 108b and an interface between the oxide semiconductor layer 108c and the oxide semiconductor layer 108b, the transfer of electrons is not interrupted in the region. Accordingly, high field-effect mobility can be obtained in the transistor 100 having the above stacked-layer structure of the oxide semiconductor layers.

Note that although trap states 390 due to impurities or defects might be formed in the vicinity of the interface between the oxide semiconductor layer 108a and the insulating layer 107 and in the vicinity of the interface between the oxide semiconductor layer 108c and the insulating layer 110 as illustrated in FIG. 6, the oxide semiconductor layer 108b can be separated from the trap states owing to the existence of the oxide semiconductor layer 108a and the oxide semiconductor layer 108c.

In the transistor 100 described in this embodiment, in a channel width direction, the side surfaces and the top surface of the oxide semiconductor layer 108b are in contact with the oxide semiconductor layer 108c, and the bottom surface of the oxide semiconductor layer 108b is in contact with the oxide semiconductor layer 108a (see FIG. 1C). In this manner, the oxide semiconductor layer 108b is surrounded by the oxide semiconductor layers 108a and 108c, whereby the influence of the trap states can be further reduced.

However, in the case where an energy difference between Ec383a or Ec383c and Ec383b is small, electrons in the oxide semiconductor layer 108b might reach the trap states by passing over the energy gap. The electrons are trapped by the trap states, which generates a negative fixed charge at the interface with the insulating layer, causing the threshold voltage of the transistor to be shifted in the positive direction.

Therefore, each of the energy differences between Ec383a and Ec383b and between Ec383c and Ec383b is preferably set to be larger than or equal to 0.1 eV, further preferably larger than or equal to 0.15 eV, in which case a change in the threshold voltage of the transistor can be reduced and the transistor can have favorable electrical characteristics.

The band gap of each of the oxide semiconductor layer 108a and the oxide semiconductor layer 108c is preferably wider than that of the oxide semiconductor layer 108b.

[Oxide Semiconductor]

An oxide semiconductor which can be used as the oxide semiconductor layer 108 is described in detail below.

The oxide semiconductor that can be used as the oxide semiconductor layers 108a, 108b, and 108c is an oxide containing indium. The oxide can have a high carrier mobility (electron mobility) by containing indium, for example.

Note that the oxide semiconductor is not limited to the oxide containing indium. The oxide semiconductor may be, for example, zinc tin oxide or gallium tin oxide.

For the oxide semiconductor, an oxide with a wide energy gap is used. For example, the energy gap of the oxide semiconductor is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

Influence of impurities in the oxide semiconductor is described below. In order to obtain stable electrical characteristics of a transistor, it is effective to reduce the concentration of impurities in the oxide semiconductor to have lower carrier density so that the oxide semiconductor is highly purified. The carrier density of the oxide semiconductor is set to be lower than $1\times10^{17}/cm^3$, lower than $1\times10^{15}/cm^3$, or lower than $1\times10^{13}/cm^3$. In order to reduce the concentration of impurities in the oxide semiconductor, the concentration of impurities in a film which is adjacent to the oxide semiconductor is preferably reduced.

For example, silicon in the oxide semiconductor might serve as a carrier trap or a carrier generation source. Therefore, the concentration of silicon in a region between the oxide semiconductor and the insulating layer 107 and a region between the oxide semiconductor and the insulating layer 110 measured by secondary ion mass spectrometry (SIMS) is set to be lower than $1\times10^{19}$ atoms/cm$^3$, preferably lower than $5\times10^{18}$ atoms/cm$^3$, further preferably lower than $2\times10^{18}$ atoms/cm$^3$.

A structure of an oxide semiconductor is described below.

An oxide semiconductor is classified into, for example, a non-single-crystal oxide semiconductor and a single crystal oxide semiconductor. Alternatively, an oxide semiconductor is classified into, for example, a crystalline oxide semiconductor and an amorphous oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

<<CAAC-OS>>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 7A:
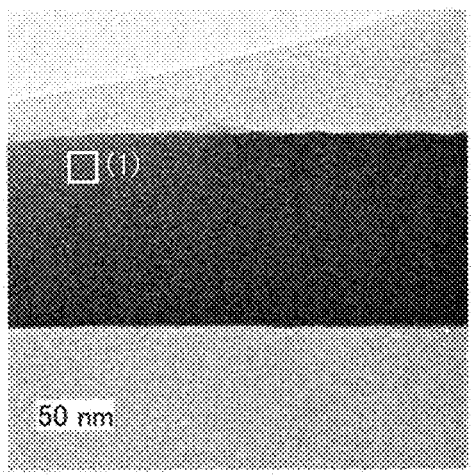
FIGS. 7A to 7D are Cs-corrected high-resolution TEM images of a cross section of a CAAC-OS and a cross-sectional schematic view of the CAAC-OS.

FIG. 7A shows an example of a high-resolution TEM image of a cross section of the CAAC-OS which is obtained from a direction substantially parallel to the sample surface. Here, the TEM image is obtained with a spherical aberration corrector function. The high-resolution TEM image obtained with a spherical aberration corrector function is particularly referred to as a Cs-corrected high-resolution TEM image in the following description. Note that the Cs-corrected high-resolution TEM image can be obtained with, for example, an atomic resolution analytical electron microscope JEM-ARM200F manufactured by JEOL Ltd.

Figure 7B:
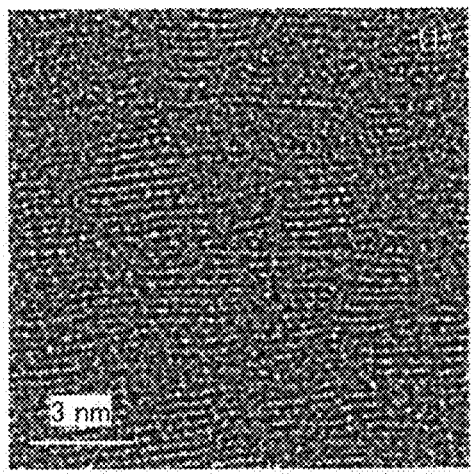

FIG. 7B is an enlarged Cs-corrected high-resolution TEM image of a region (1) in FIG. 7A. FIG. 7B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 7C:
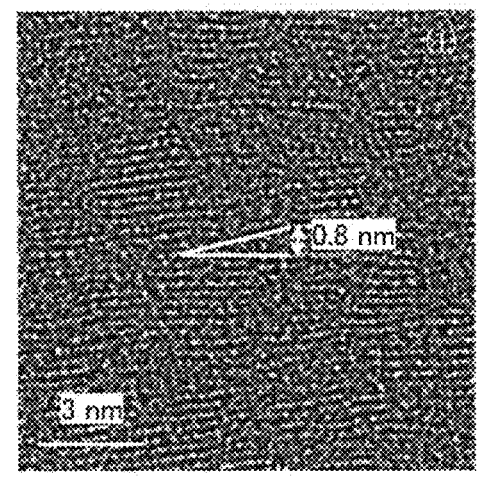

As shown in FIG. 7B, the CAAC-OS has a characteristic atomic arrangement. The characteristic atomic arrangement is denoted by an auxiliary line in FIG. 7C. FIGS. 7B and 7C prove that the size of a pellet is approximately 1 nm to 3 nm, and the size of a space caused by tilt of the pellets is approximately 0.8 nm. Therefore, the pellet can also be referred to as a nanocrystal (nc).

Figure 7D:
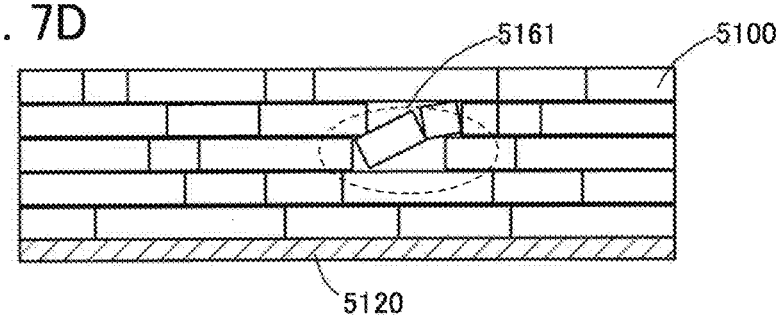

Here, according to the Cs-corrected high-resolution TEM images, the schematic arrangement of pellets 5100 of a CAAC-OS over a substrate 5120 is illustrated by such a structure in which bricks or blocks are stacked (see FIG. 7D). The part in which the pellets are tilted as observed in FIG. 7C corresponds to a region 5161 shown in FIG. 7D.

Figure 8A:
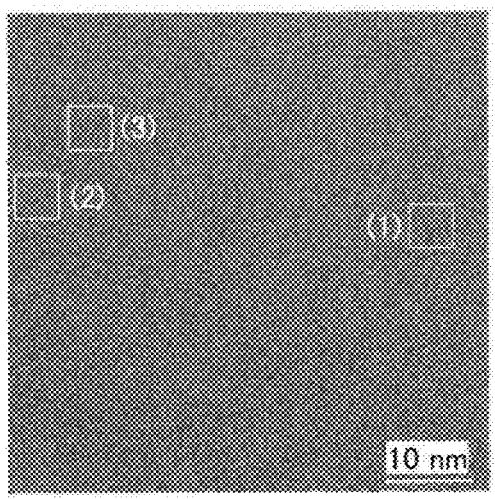
FIGS. 8A to 8D are Cs-corrected high-resolution TEM images of a plane of a CAAC-OS.
Figure 8B:
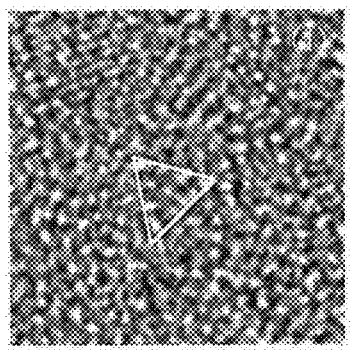
Figure 8C:
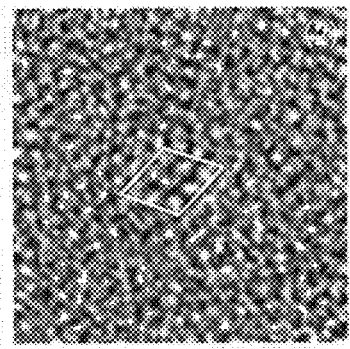
Figure 8D:
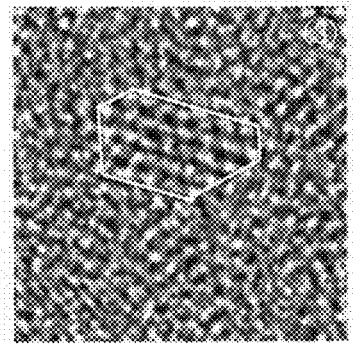

For example, as shown in FIG. 8A, a Cs-corrected high-resolution TEM image of a plane of the CAAC-OS obtained from a direction substantially perpendicular to the sample surface is observed. FIGS. 8B, 8C, and 8D are enlarged Cs-corrected high-resolution TEM images of regions (1), (2), and (3) in FIG. 8A, respectively. FIGS. 8B, 8C, and 8D indicate that metal atoms are arranged in a triangular, quadrangular, or hexagonal configuration in a pellet. However, there is no regularity of arrangement of metal atoms between different pellets.

Figure 9A:
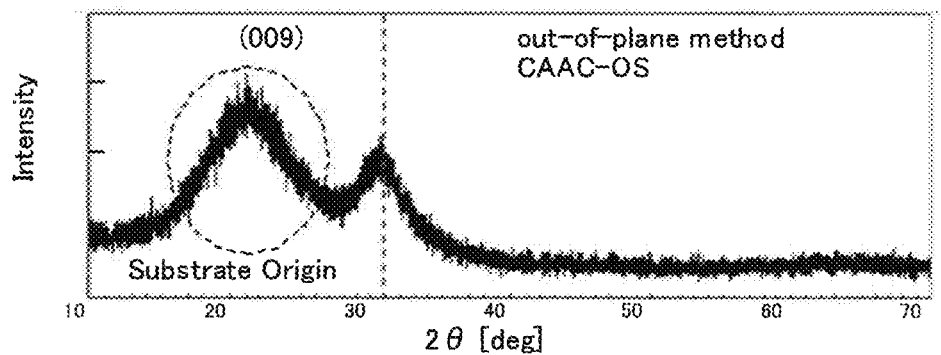
FIGS. 9A to 9C show structural analysis of a CAAC-OS and a single crystal oxide semiconductor by XRD.

For example, when the structure of a CAAC-OS including an InGaZnO$_4$ crystal is analyzed by an out-of-plane method using an X-ray diffraction (XRD) apparatus, a peak appears at a diffraction angle (2θ) of around 31° as shown in FIG. 9A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS including an InGaZnO$_4$ crystal by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS, a peak appear when 2θ is around 31° and that a peak not appear when 2θ is around 36°.

Figure 9B:
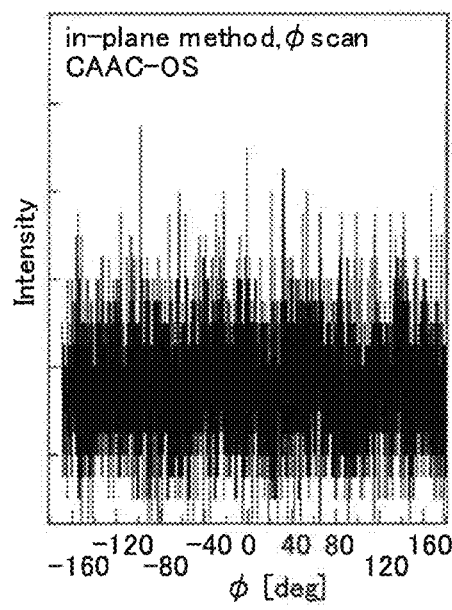
Figure 9C:
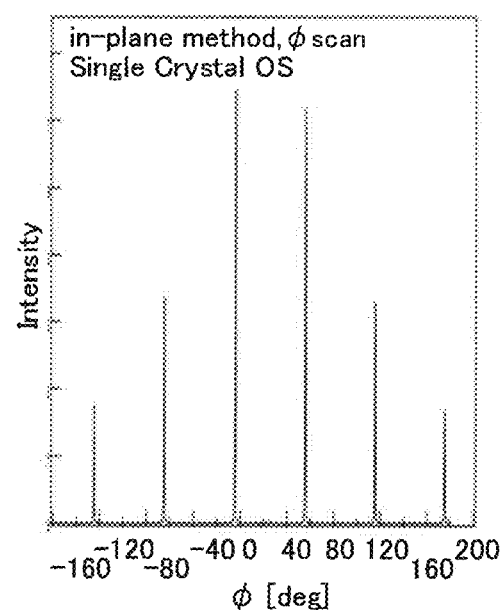

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 9B, a peak is not clearly observed. In contrast, in the case of a single crystal oxide semiconductor of InGaZnO$_4$, when φ scan is performed with 2θ fixed at around 56°, as shown in FIG. 9C, six peaks which are derived from crystal planes equivalent to the (110) plane are observed. Accordingly, the structural analysis using XRD shows that the directions of a-axes and b-axes are different in the CAAC-OS.

Figure 10A:
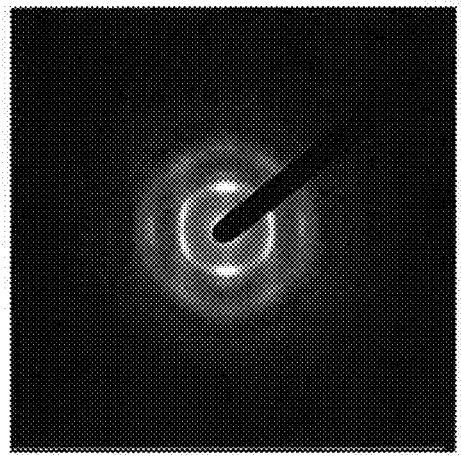
FIGS. 10A and 10B show electron diffraction patterns of a CAAC-OS.
Figure 10B:
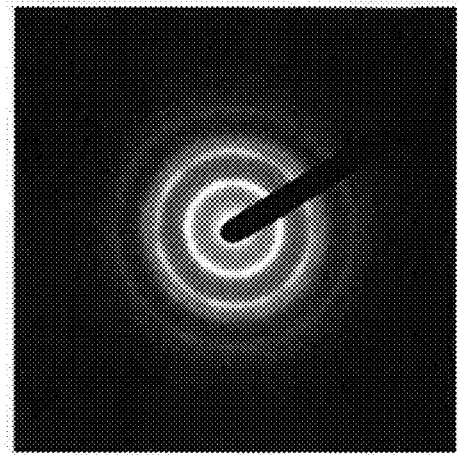

Next, FIG. 10A shows a diffraction pattern (also referred to as a selected-area transmission electron diffraction pattern) obtained in such a manner that an electron beam with a probe diameter of 300 nm is incident on an In—Ga—Zn oxide that is a CAAC-OS in a direction parallel to the sample surface. As shown in FIG. 10A, for example, spots derived from the (009) plane of an InGaZnO$_4$ crystal are observed. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 10B shows a diffraction pattern obtained in such a manner that an electron beam with a probe diameter of 300 nm is incident on the same sample in a direction perpendicular to the sample surface. As shown in FIG. 10B, a ring-like diffraction pattern is observed. Thus, the electron diffraction also indicates that the a-axes and b-axes of the pellets included in the CAAC-OS do not have regular alignment. The first ring in FIG. 10B is considered to be derived from the (010) plane, the (100) plane, and the like of the InGaZnO$_4$ crystal. The second ring in FIG. 10B is considered to be derived from the (110) plane and the like.

Since the c-axes of the pellets (nanocrystals) are aligned in a direction substantially perpendicular to the formation surface or the top surface in the above manner, the CAAC-OS can also be referred to as an oxide semiconductor including c-axis aligned nanocrystals (CANC).

The CAAC-OS is an oxide semiconductor with a low impurity concentration. The impurity means an element other than the main components of the oxide semiconductor, such as hydrogen, carbon, silicon, or a transition metal element. An element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity. Additionally, the impurity contained in the oxide semiconductor might serve as a carrier trap or a carrier generation source.

Moreover, the CAAC-OS is an oxide semiconductor having a low density of defect states. For example, oxygen vacancies in the oxide semiconductor serve as carrier traps or serve as carrier generation sources when hydrogen is captured therein.

In a transistor using the CAAC-OS, change in electrical characteristics due to irradiation with visible light or ultraviolet light is small.

<<Microcrystalline Oxide Semiconductor>>

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in an electron diffraction pattern of the nc-OS when an electron beam having a probe diameter (e.g., larger than or equal to 1 nm and smaller than or equal to 30 nm) close to or smaller than the size of a pellet is applied (the electron diffraction using such an electron beam is referred to as nanobeam electron diffraction). Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<<Amorphous Oxide Semiconductor>>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

Note that an oxide semiconductor may have a structure having physical properties intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

A difference in effect of electron irradiation between structures of an oxide semiconductor is described below.

An a-like OS (Sample A), an nc-OS (Sample B), and a CAAC-OS (Sample C) are prepared. Each of the samples is an In—Ga—Zn oxide.

First, a high-resolution cross-sectional TEM image of each sample is obtained. The high-resolution cross-sectional TEM images show that all the samples have crystal parts.

Figure 11:
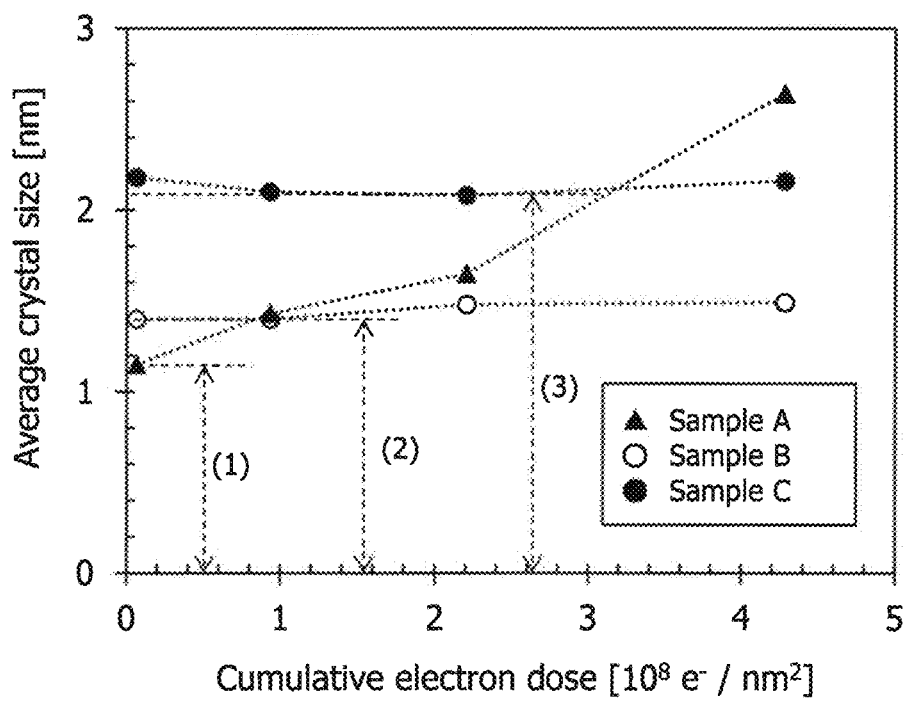
FIG. 11 shows a change of crystal parts of In—Ga—Zn oxides owing to electron irradiation.

Then, the size of the crystal part of each sample is measured. FIG. 11 shows the change in the average size of crystal parts (at 22 points to 45 points) in each sample. FIG. 11 indicates that the crystal part size in the a-like OS increases with an increase in the cumulative electron dose. Specifically, as shown by (1) in FIG. 11, a crystal part of approximately 1.2 nm at the start of TEM observation (the crystal part is also referred to as an initial nucleus) grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$ regardless of the cumulative electron dose. Specifically, as shown by (2) in FIG. 11, the average crystal size in the nc-OS is approximately 1.4 nm regardless of the observation time by TEM. Furthermore, as shown by (3) in FIG. 11, the average crystal size in the CAAC-OS is approximately 2.1 nm regardless of the observation time by TEM.

In this manner, growth of the crystal part occurs due to the crystallization of the a-like OS, which is induced by a slight amount of electron beam employed in the TEM observation. In contrast, in the nc-OS and the CAAC-OS that have good quality, crystallization hardly occurs by a slight amount of electron beam used for TEM observation.

Note that the crystal part size in the a-like OS and the nc-OS can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor varies depending on the structure in some cases. For example, when the composition of an oxide semiconductor is determined, the structure of the oxide semiconductor can be expected by comparing the density of the oxide semiconductor with the density of a single crystal oxide semiconductor having the same composition as the oxide semiconductor. For example, the density of the a-like OS is higher than or equal to 78.6% and lower than 92.3% of the density of the single crystal oxide semiconductor having the same composition. For example, the density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

Specific examples of the above description are given. For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor may be a stacked film including two or more films of an amorphous oxide semiconductor, an a-like OS, a microcrystalline oxide semiconductor, and a CAAC-OS, for example.

An oxide semiconductor having a low impurity concentration and a low density of defect states (a small number of oxygen vacancies) can have low carrier density. Therefore, such an oxide semiconductor is referred to as a highly purified intrinsic or substantially highly purified intrinsic oxide semiconductor. A CAAC-OS and an nc-OS have a low impurity concentration and a low density of defect states as compared to an a-like OS and an amorphous oxide semiconductor. That is, a CAAC-OS and an nc-OS are likely to be highly purified intrinsic or substantially highly purified intrinsic oxide semiconductors. Thus, a transistor including a CAAC-OS or an nc-OS rarely has negative threshold voltage (is rarely normally on). The highly purified intrinsic or substantially highly purified intrinsic oxide semiconductor has few carrier traps. Therefore, a transistor including a CAAC-OS or an nc-OS has small variation in electrical characteristics and high reliability. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics.

<Deposition Model>

Examples of deposition models of a CAAC-OS and an nc-OS are described below.

Figure 12A:
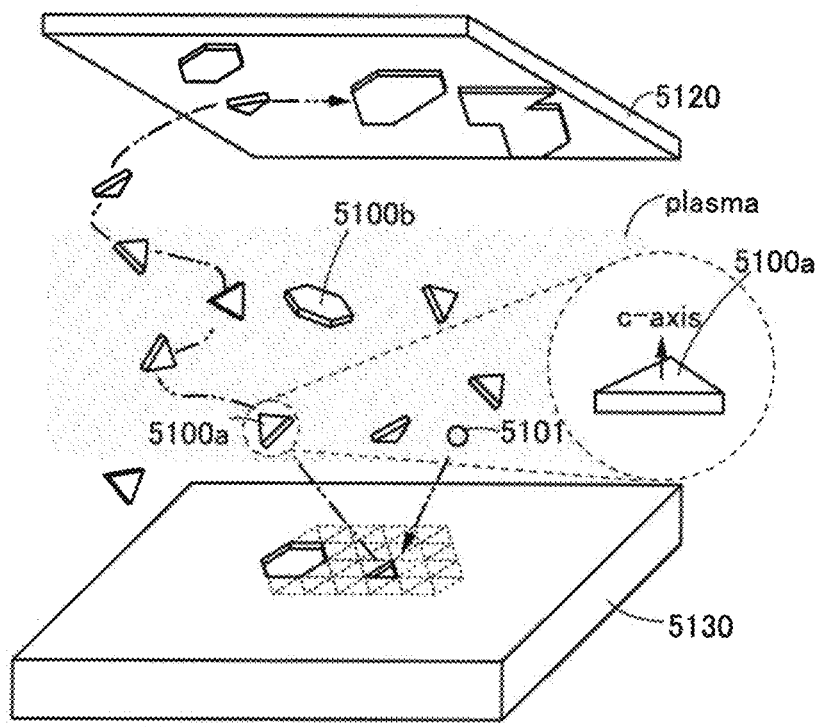
FIGS. 12A and 12B are schematic views showing deposition models of a CAAC-OS and an nc-OS.

FIG. 12A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The target 5130 has a polycrystalline structure in which a cleavage plane exists in at least one crystal grain.

Figure 13A:
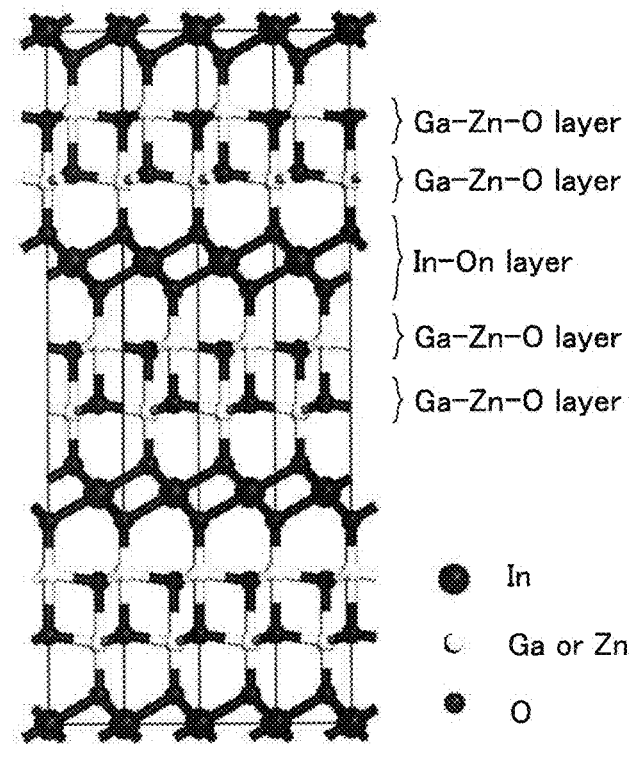
FIGS. 13A to 13C show an InGaZnO$_4$ crystal and a pellet.

A cleavage plane of the target 5130 including an In—Ga—Zn oxide is described as an example. FIG. 13A shows a structure of an $InGaZnO_4$ crystal included in the target 5130. Note that FIG. 13A shows a structure of the case where the InGaZnO$_4$ crystal is observed from a direction parallel to the b-axis when the c-axis is in an upward direction.

FIG. 13A indicates that oxygen atoms in a Ga—Zn—O layer are positioned close to those in an adjacent Ga—Zn—O layer. The oxygen atoms have negative charge, whereby the two Ga—Zn—O layers repel each other. As a result, the InGaZnO$_4$ crystal has a cleavage plane between the two adjacent Ga—Zn—O layers.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

The ion 5101 is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 13B:
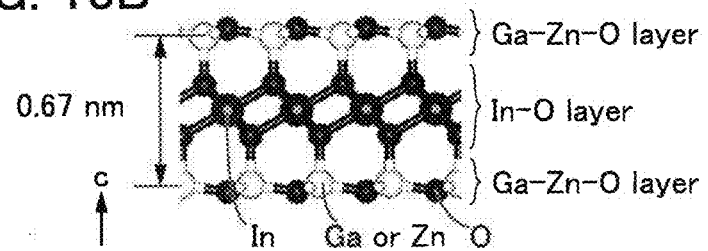
Figure 13C:
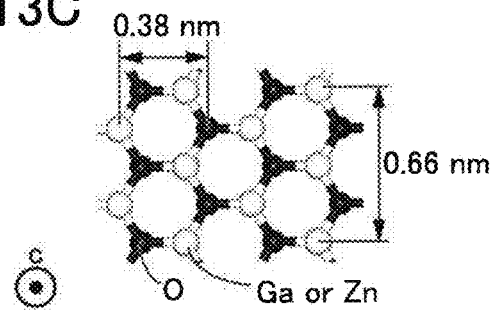

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 11. For example, in the case where the ion 5101 collides with the target 5130 including an In—Ga—Zn oxide, the pellet 5100 that includes three layers of a Ga—Zn—O layer, an In—O layer, and a Ga—Zn—O layer as shown in FIG. 13B is ejected. Note that FIG. 13C shows the structure of the pellet 5100 observed from a direction parallel to the c-axis. Therefore, the pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. The pellet 5100 includes an oxygen atom on its side surface, and the oxygen atom may be negatively charged. In this manner, when the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 11 corresponds to the amount of growth in plasma. Here, in the case where the temperature of the substrate 5120 is at around room temperature, the pellet 5100 does not grow anymore; thus, an nc-OS is formed (see FIG. 12B). An nc-OS can be deposited when the substrate 5120 has a large size because a temperature at which the deposition of an nc-OS is carried out is approximately room temperature. Note that in order that the pellet 5100 grows in plasma, it is effective to increase deposition power in sputtering. High deposition power can stabilize the structure of the pellet 5100.

Figure 12B:
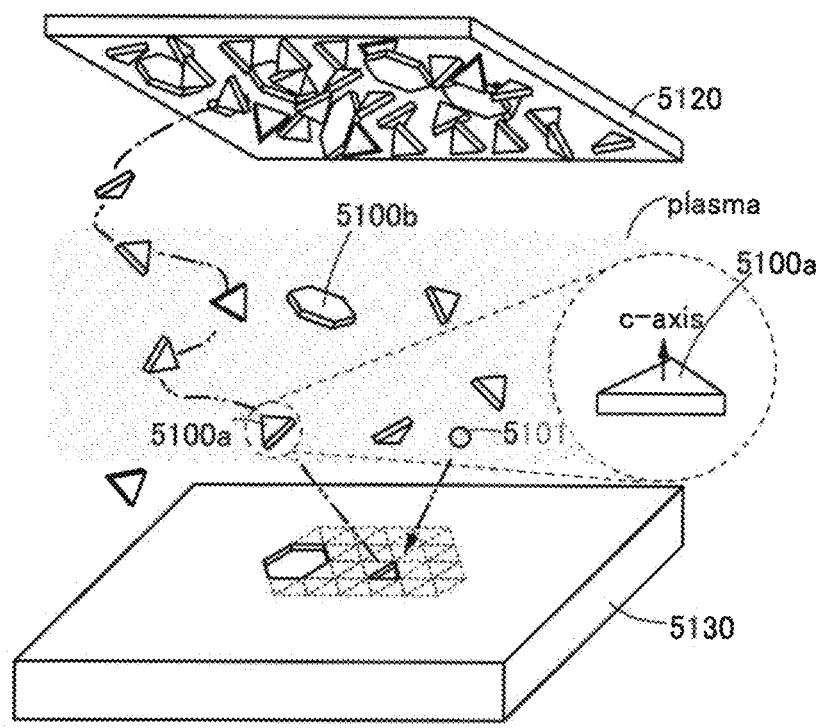

As shown in FIGS. 12A and 12B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to increase a force applied to the pellet 5100, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 12A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist therebetween. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target is sputtered with an ion, in addition to the pellets, zinc oxide or the like may be ejected. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 14A to 14D are cross-sectional schematic views.

Figure 14A:
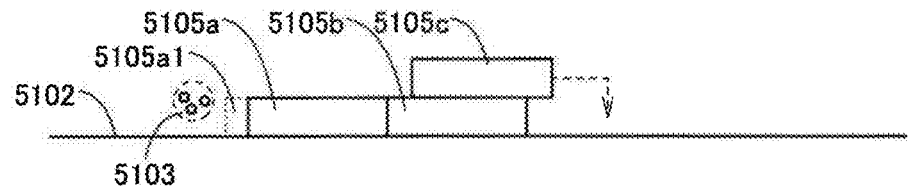
FIGS. 14A to 14D are schematic diagrams illustrating a deposition model of a CAAC-OS.

As illustrated in FIG. 14A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 ejected from the target together with the zinc oxide is crystallized by heating of the substrate 5120 to form a region 5105a1 on another side surface of the pellet 5105a. Note that the plurality of particles 5103 may contain oxygen, zinc, indium, gallium, or the like.

Figure 14B:
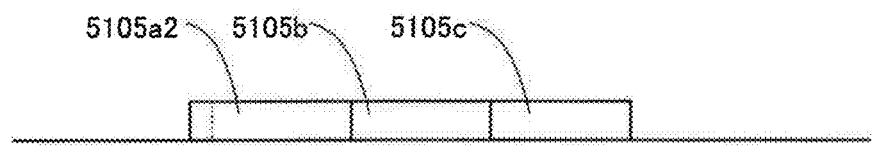
Figure 14C:
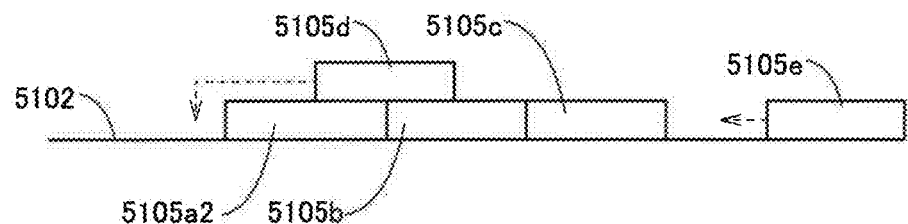

Then, as illustrated in FIG. 14B, the region 5105a1 grows to part of the pellet 5105a to form a pellet 5105a2. In addition, a side surface of the pellet 5105c is in contact with another side surface of the pellet Next, as illustrated in FIG. 14C, a pellet 5105d is deposited over the pellet 5105a2 and the pellet 5105b, and then glides over the pellet 5105a2 and the pellet 5105b. Further-more, a pellet 5105e glides toward another side surface of the pellet 5105c over the zinc oxide layer 5102.

Figure 14D:
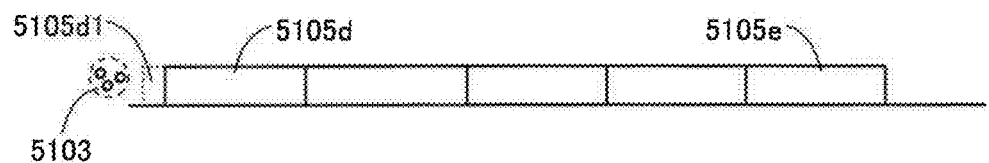

Then, as illustrated in FIG. 14D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 ejected from the target together with the zinc oxide is crystallized by heating of the substrate 5120 to form a region 5105dl on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 11 corresponds to the amount of growth after deposition.

When spaces between pellets 5100 are extremely small, the pellets may form a large pellet. The large pellet has a single crystal structure. For example, the size of the large pellet may be greater than or equal to 10 nm and less than or equal to 200 nm, greater than or equal to 15 nm and less than or equal to 100 nm, or greater than or equal to 20 nm and less than or equal to 50 nm, when seen from the above. Therefore, when a channel formation region of a transistor is smaller than the large pellet, the region having a single crystal structure can be used as the channel formation region. Furthermore, when the size of the pellet is increased, the region having a single crystal structure can be used as the channel formation region, the source region, and the drain region of the transistor. In this manner, when the channel formation region or the like of the transistor is formed in a region having a single crystal structure, the frequency characteristics of the transistor can be increased in some cases.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure, which is different from film deposition by epitaxial growth. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be obtained.

As a result, laser crystallization is not needed for formation of a CAAC-OS, and a uniform film can be formed even over a large-sized glass substrate or the like.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

FIG. 15A is a high-resolution cross-sectional TEM image of a CAAC-OS film. FIG. 15B is a high-resolution cross-sectional TEM image obtained by enlarging the image of FIG. 15A. In FIG. 15B, atomic arrangement is highlighted for easy understanding.

FIG. 15C is local Fourier transform images of regions surrounded by circles (the diameter is about 4 nm) between A and O and between O and A' in FIG. 15A. C-axis alignment can be observed in each region in FIG. 15C. The c-axis direction between A and O is different from that between O and A', which indicates that a grain in the region between A and O is different from that between O and A'. In addition, the angle of the c-axis between A and O continuously changes, for example, 14.3°, 16.6□□ and 26.4°. Similarly, the angle of the c-axis between O and A' continuously changes, for example, −18.30, −17.6°, and −15.9°.

The results of the high-resolution cross-sectional TEM image and the high-resolution plan TEM image show that the crystal parts in the CAAC-OS film have alignment.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the high-resolution plan TEM image.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that an oxide semiconductor may include two or more of an amorphous oxide semiconductor, a microcrystalline oxide semiconductor, and a CAAC-OS, for example. In the case where the oxide semiconductor has a plurality of structures, the structures can be analyzed using nanobeam electron diffraction in some cases.

FIG. 16C illustrates a transmission electron diffraction measurement apparatus which includes an electron gun chamber 1010, an optical system 1012 below the electron gun chamber 1010, a sample chamber 1014 below the optical system 1012, an optical system 1016 below the sample chamber 1014, an observation chamber 1020 below the optical system 1016, a camera 1018 installed in the observation chamber 1020, and a film chamber 1022 below the observation chamber 1020. The camera 1018 is provided to face toward the inside of the observation chamber 1020. Note that the film chamber 1022 is not necessarily provided.

FIG. 16D illustrates an internal structure of the transmission electron diffraction measurement apparatus illustrated in FIG. 16C. In the transmission electron diffraction measurement apparatus, a substance 1028 which is positioned in the sample chamber 1014 is irradiated with electrons emitted from an electron gun installed in the electron gun chamber 1010 through the optical system 1012. Electrons passing through the substance 1028 enter a fluorescent plate 1032 provided in the observation chamber 1020 through the optical system 1016. A pattern which depends on the intensity of the incident electrons appears in the fluorescent plate 1032, so that the transmitted electron diffraction pattern can be measured.

The camera 1018 is installed so as to face the fluorescent plate 1032 and can take a picture of a pattern that has appeared in the fluorescent plate 1032. An angle formed by a straight line which passes through the center of a lens of the camera 1018 and the center of the fluorescent plate 1032 and an upper surface of the fluorescent plate 1032 is, for example, 15° or more and 80° or less, 30° or more and 75° or less, or 45° or more and 70° or less. As the angle is reduced, distortion of the transmission electron diffraction pattern taken by the camera 1018 becomes larger. Note that if the angle is obtained in advance, the distortion of an obtained transmission electron diffraction pattern can be corrected. Note that the film chamber 1022 may be provided with the camera 1018. For example, the camera 1018 may be set in the film chamber 1022 so as to be opposite to the incident direction of electrons 1024. In this case, a transmission electron diffraction pattern with less distortion can be taken from the rear surface of the fluorescent plate 1032.

A holder for fixing the substance 1028 that is a sample is provided in the sample chamber 1014. The holder transmits electrons passing through the substance 1028. The holder may have, for example, a function of moving the substance 1028 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 1028.

Then, a method for measuring a transmission electron diffraction pattern of a substance by the above-described transmission electron diffraction measurement apparatus will be described.

For example, changes in the structure of a substance can be observed by changing (scanning) the irradiation position of the electrons 1024 that are a nanobeam in the substance, as illustrated in FIG. 16D. At this time, when the substance 1028 is a CAAC-OS, a diffraction pattern as shown in FIG. 16A is observed. When the substance 1028 is an nc-OS, a diffraction pattern shown in FIG. 16B is observed.

Even when the substance 1028 is a CAAC-OS, a diffraction pattern similar to that of an nc-OS or the like is partly observed in some cases. Therefore, whether or not a CAAC-OS is favorable can be determined by the proportion of a region where a diffraction pattern of a CAAC-OS is observed in a predetermined area (also referred to as proportion of CAAC). In the case of a high quality CAAC-OS, for example, the proportion of CAAC is higher than or equal to 60%, preferably higher than or equal to 80%, further preferably higher than or equal to 90%, still further preferably higher than or equal to 95%. Note that the proportion of a region where a diffraction pattern different from that of a CAAC-OS is observed is referred to as the proportion of non-CAAC.

For example, transmission electron diffraction patterns were obtained by scanning a top surface of a sample including a CAAC-OS obtained just after deposition (represented as "as-depo") and a top surface of a sample including a CAAC-OS subjected to heat treatment at 450° C. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used.

Figure 17A:
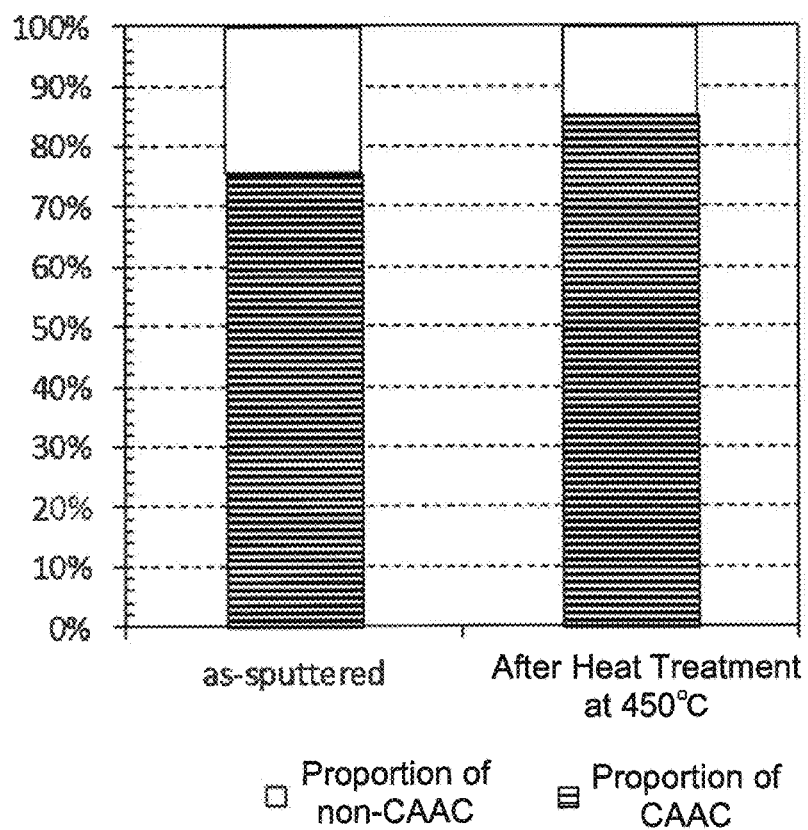
FIG. 17A shows an example of structural analysis by transmission electron diffraction measurement and FIGS. 17B and 17C show planar TEM images.
Figure 17B:
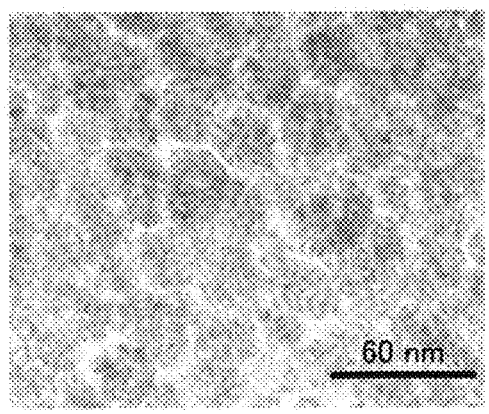
Figure 17C:
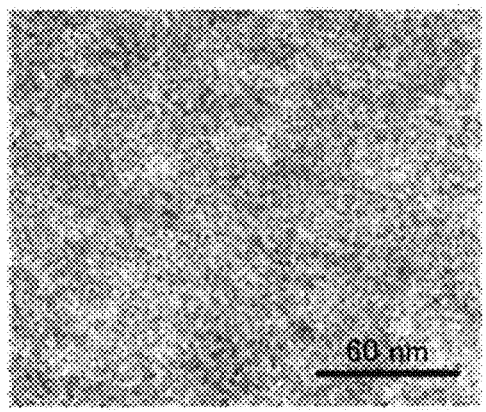

FIGS. 17A to 17C show the proportion of CAAC in each sample. The proportion of CAAC of the sample after heat treatment at 450° C. is high compared with that of the sample of as-depo. That is, by heat treatment at a temperature higher than 450° C., the proportion of non-CAAC is lowered (the proportion of CAAC is increased). Here, most of diffraction patterns different from that of a CAAC-OS are diffraction patterns similar to that of an nc-OS. Therefore, the above results suggest that the region having a structure similar to that of an nc-OS is rearranged by the heat treatment owing to the influence of the structure of the adjacent region, whereby the region becomes CAAC.

With such a measurement method, the structure of an oxide semiconductor having a plurality of structures can be analyzed in some cases.

Note that here although an example in which the oxide semiconductor layer 108 is used is described, one embodiment of the present invention is not limited thereto. In some cases or depending on the situation, a semiconductor film containing a different material may be used instead of the oxide semiconductor layer 108. For example, a semiconductor film containing one or more elements selected from silicon, germanium, gallium, arsenic, and the like may be used for a channel region, a source/drain region, an LDD region, or the like, instead of using the oxide semiconductor layer 108.

[A-8: Electrodes 109 and 119]

The electrode 109 and the electrode 119 can be formed using a material and a method that are similar to those of the electrodes 102a, 103a, and 104a and the electrodes 102b, 103b, and 104b.

At least a portion of the electrode 109 and a portion of the electrode 119 which are in contact with the oxide semiconductor layer 108b are preferably formed using a conductive material that does not transmit oxygen. By providing the conductive material that does not transmit oxygen in at least the portions that are in contact with the oxide semiconductor layer 108b, oxygen included in the oxide semiconductor layer 108 cannot be easily diffused to the electrode 109 and the electrode 119.

[A-9: Insulating Layer 110]

The insulating layer 110 can be formed using a material and a method that are similar to those of the insulating layer 105.

The insulating layer 110 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density corresponding to a signal with a g factor of 2.001 in ESR is less than or equal to $3\times10^{17}$ spins/cm$^3$, preferably less than or equal to $5\times10^{16}$ spins/cm$^3$ is used. As the silicon oxide layer, a silicon oxide layer containing excess oxygen is preferably used. As the silicon nitride layer, a silicon nitride layer from which hydrogen and ammonia are less likely to be released is used. The amount of released hydrogen or ammonia may be measured by TDS.

Furthermore, the hydrogen concentration in the insulating layer 110 is preferably low in order to prevent an increase in the hydrogen concentration in the oxide semiconductor. Specifically, the hydrogen concentration in the insulating layer 110, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Furthermore, the nitrogen concentration in the insulating layer 110 is preferably low in order to prevent an increase in the nitrogen concentration in the oxide semiconductor. Specifically, the nitrogen concentration in the insulating layer 110, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The insulating layer 110 is preferably formed using an insulating layer containing oxygen at a higher proportion than oxygen in the stoichiometric composition. From the insulating layer containing oxygen at a higher proportion than oxygen in the stoichiometric composition, part of oxygen is released by heating. The insulating layer containing oxygen at a higher proportion than oxygen in the stoichiometric composition is an insulating layer of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C. In this specification and the like, oxygen in an insulating layer whose amount is in excess of the amount of oxygen in the stoichiometric composition is referred to as "excess oxygen". Furthermore, in this specification and the like, an insulating layer containing oxygen at a higher proportion than oxygen in the stoichiometric composition is referred to as an "insulating layer containing excess oxygen".

[A-10: Electrode 111]

The electrode 111 can be formed using a material and a method that are similar to those of the electrode 109 and the electrode 119. The thickness of the electrode 111 may be greater than or equal to 10 nm and less than or equal to 500 nm, and is preferably greater than or equal to 50 nm and less than or equal to 300 nm.

[A-11: Insulating Layer 112]

The insulating layer 112 can be formed using a material and a method that are similar to those of the insulating layer 106. The thickness of the insulating layer 112 may be greater than or equal to 10 nm and less than or equal to 500 nm, and is preferably greater than or equal to 50 nm and less than or equal to 300 nm.

<B: Example of Manufacturing Method of Transistor 100 and Capacitor 130>

An example of a manufacturing method of the transistor 100 will be described with reference to cross-sectional views of FIGS. 2A to 2D, FIGS. 3A to 3C, FIGS. 4A to 4C, and FIGS. 5A and 5B.

[B-1: Formation of Electrodes 102, 103 and 104]

First, a conductive layer (not illustrated) for forming the electrode 102a, the electrode 103a, and the electrode 104a and a conductive layer (not illustrated) for forming the electrode 102b, the electrode 103b, and the electrode 104b are stacked over the substrate 101. Each conductive layer can be formed by a sputtering method, a CVD method, an evaporation method, or the like.

For example, in the case where a tungsten film is formed as the conductive layer, a $WF_6$ gas and a $B_2H_6$ gas are sequentially introduced multiple times to form an initial tungsten film, and then a $WF_6$ gas and an $H_2$ gas are introduced at a time, so that a tungsten film is formed. Note that an $SiH_4$ gas may be used instead of a $B_2H_6$ gas.

In this embodiment, the conductive layer for forming the electrode 102a, the electrode 103a, and the electrode 104a is a tungsten film with a thickness of 150 nm deposited by a sputtering method. Furthermore, the conductive layer for forming the electrode 102b, the electrode 103b, and the electrode 104b is an indium gallium zinc oxide film containing nitrogen with a thickness of 50 nm deposited by a sputtering method.

Then, part of each conductive layer is selectively etched using a resist mask, so that the gate electrode 102, the electrode 103, and the electrode 104 (including other electrodes and wirings formed using the same conductive layers) are formed. The resist mask can be formed by a photolithography method, a printing method, an inkjet method, or the like as appropriate. Formation of the resist mask by an inkjet method needs no photomask; thus, manufacturing cost can be reduced.

The etching of the conductive layers may be performed by a dry etching method, a wet etching method, or both a dry etching method and a wet etching method. As a plasma source in the case where the etching of the oxide semiconductor film is performed by a dry etching method, a capacitively coupled plasma (CCP), an inductively coupled plasma (ICP), an electron cyclotron resonance (ECR) plasma, a helicon wave plasma (HWP), a microwave-excited surface wave plasma (SWP), or the like can be used. In particular, with ICP, ECR, HWP, and SWP, a high density plasma can be generated. In the case of performing etching by a dry etching method (hereinafter also referred to as "dry etching treatment"), the etching conditions (the amount of electric power applied to a coil-shaped electrode, the amount of electric power applied to an electrode on a substrate side, the temperature of the electrode on the substrate side, and the like) are adjusted as appropriate so that the layer can be etched into a desired shape. After the etching of the conductive layers, the resist mask is removed (see FIG. 2A).

[B-2: Formation of Insulating Layer 105]

Next, the insulating layer 105 is formed over the electrode 102, the electrode 103, and the electrode 104. The insulating layer 105 can be formed by a sputtering method, a CVD method, an evaporation method, or the like. In particular, an ALD method, an MOCVD method, or a thermal CVD method are preferably used, in which case damage is little since plasma is not used.

For example, in the case where a silicon oxide film is formed as the insulating layer 105 by a thermal CVD method, hexachlorodisilane is adsorbed on a deposition surface, chlorine contained in the adsorbate is removed, and radicals of an oxidizing gas (e.g., $O_2$ or dinitrogen monoxide) are supplied to react with the adsorbate.

For example, in the case where a hafnium oxide film is formed as the insulating layer 105 by a thermal CVD method, two kinds of gases, i.e., ozone ($O_3$) as an oxidizer and a source material gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

Figure 2A:
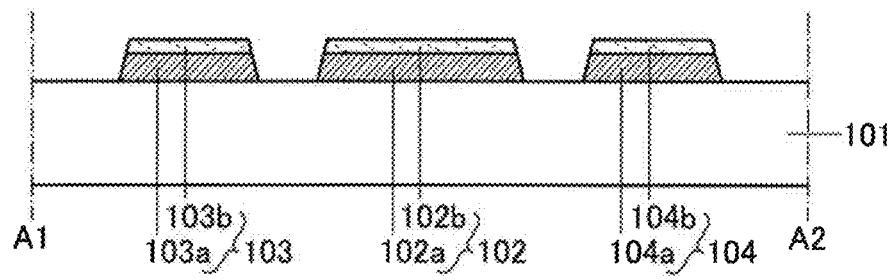
FIGS. 2A to 2D illustrate an example of a manufacturing process of the transistor of one embodiment of the present invention.
Figure 2B:
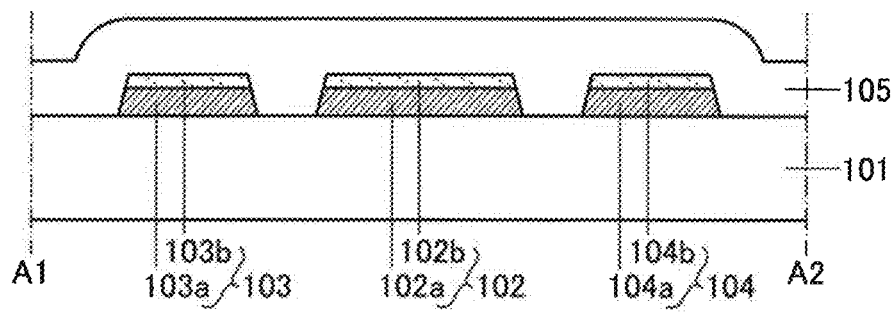

In this embodiment, as the insulating layer 105, a 250-nm-thick silicon oxynitride film is formed by a plasma CVD method (see FIG. 2B).

Figure 2C:
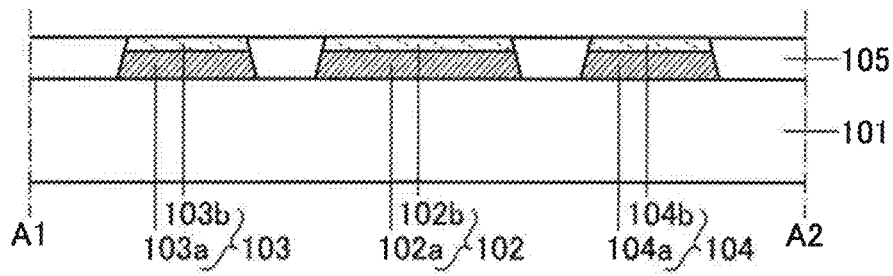
Figure 2D:
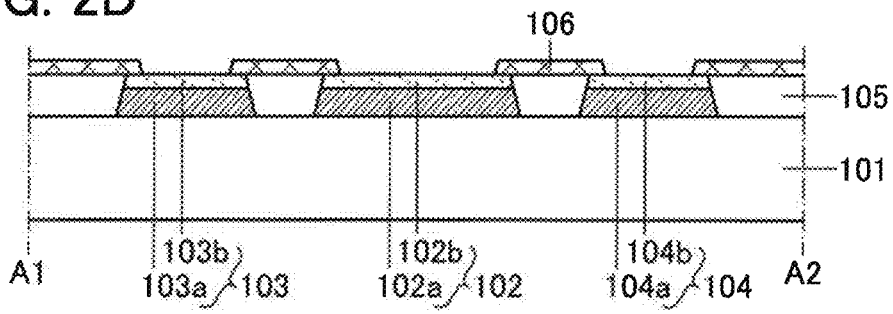

Next, chemical mechanical polishing (CMP) treatment is performed to expose surfaces of the electrode 102b, the electrode 103b, and the electrode 104b (see FIG. 2C). By the CMP treatment, unevenness of the surfaces can be reduced, and coverage with an insulating layer or a conductive layer to be formed later can be increased.

Here, heat treatment may be performed to reduce hydrogen, nitrogen, water, and the like contained in the electrode 102, the electrode 103, the electrode 104, and the insulating layer 105. The heat treatment is performed at a temperature higher than or equal to 300° C. and lower than or equal to 800° C., preferably higher than or equal to 400° C. and lower than or equal to 700° C. The treatment time is shorter than or equal to 24 hours. Heat treatment for longer than 24 hours is not preferable because the productivity is reduced.

There is no particular limitation on a heat treatment apparatus used for the heat treatment, and the apparatus may be provided with a device for heating an object by heat radiation or heat conduction from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas.

In particular, in the case where a semiconductor substrate over which a semiconductor element is provided is used as the substrate 101, the heat treatment is preferably performed to reduce the hydrogen concentration of the substrate 101.

[B-3: Formation of Insulating Layer 106]

Then, the insulating layer 106 is formed over the electrode 102, the electrode 103, the electrode 104, and the insulating layer 105. The insulating layer 106 can be formed by a sputtering method, a CVD method, an evaporation method, or the like. In particular, an ALD method, an MOCVD method, or a thermal CVD method are preferably used, in which case damage is little since plasma is not used.

For example, in the case where an aluminum oxide film is formed as the insulating layer 106 by a thermal CVD method, two kinds of gases, e.g., $H_2O$ as an oxidizer and a source material gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris (2,2,6,6-tetramethyl-3,5-heptanedionate).

In this embodiment, a 50-nm-thick aluminum oxide layer is formed as the insulating layer 106 by a sputtering method.

Next, portions of the insulating layer 106 which overlap with the electrode 102, the electrode 103, and the electrode 104 are etched selectively using a resist mask, so that the surfaces of the electrode 102b, the electrode 103b, and the electrode 104b are exposed. The insulating layer 106 may be etched by either one or both of a dry etching method and a wet etching method. After the etching of the insulating layer 106, the resist mask is removed (see FIG. 2D).

[B-4: Formation of Insulating Layer 107]

Then, the insulating layer 107 is formed over the electrode 102, the electrode 103, the electrode 104, and the insulating layer 106. The insulating layer 107 can be formed by a sputtering method, a CVD method, an evaporation method, or the like. In this embodiment, as the insulating layer 107, a silicon oxynitride film containing oxygen at a higher proportion than oxygen in the stoichiometric composition with a thickness of 150 nm is formed by a CVD method.

The insulating layer containing excess oxygen can be formed by performing treatment for adding oxygen to an insulating layer. The treatment for adding oxygen can be performed by heat treatment under an oxygen atmosphere or performed with an ion implantation apparatus, an ion doping apparatus, or a plasma treatment apparatus. As the ion doping apparatus, an ion doping apparatus with a mass separation function may be used. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

In order to reduce unevenness of a surface, CMP treatment may be performed.

[B-5: Formation of Oxide Semiconductor Layers 108a and 108b]

Figure 3A:
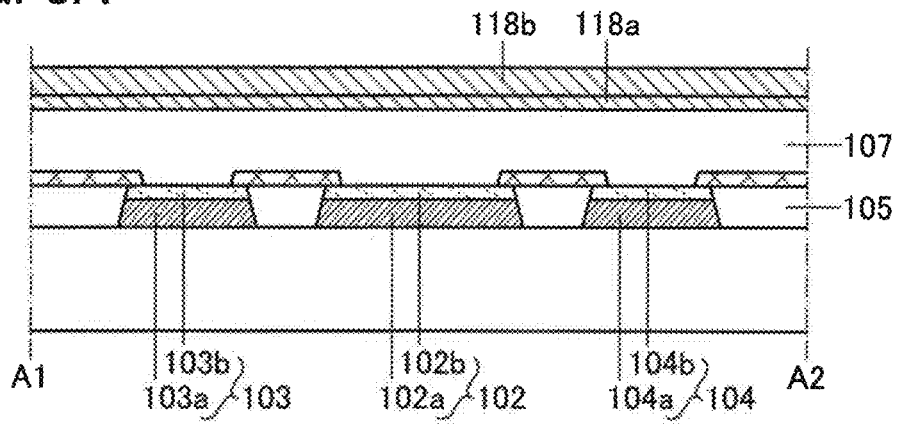
FIGS. 3A to 3C illustrate an example of the manufacturing process of the transistor of one embodiment of the present invention.
Figure 3B:
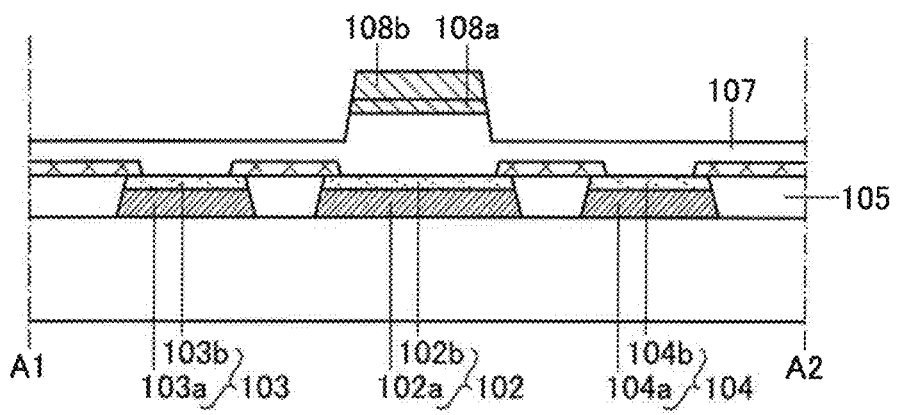

Next, an oxide semiconductor layer 118a for forming the oxide semiconductor layer 108a and an oxide semiconductor layer 118b for forming the oxide semiconductor layer 108b are formed over the insulating layer 107 (see FIG. 3A).

In this embodiment, as the oxide semiconductor layer 118a, an In—Ga—Zn oxide film with a thickness of 20 nm is formed by a sputtering method using a target with an atomic ratio of In:Ga:Zn=1:3:4. As the oxide semiconductor layer 118b, an In—Ga—Zn oxide film with a thickness of 20 nm is formed using a target with an atomic ratio of In:Ga:Zn=1:1:1.

Next, heat treatment is preferably performed to reduce impurities such as moisture and hydrogen contained in the oxide semiconductor layer 118a and the oxide semiconductor layer 118b and to purify the oxide semiconductor layer 118a and the oxide semiconductor layer 118b.

For example, the oxide semiconductor layer 118a and the oxide semiconductor layer 118b are subjected to heat treatment in a reduced-pressure atmosphere, an inert gas atmosphere of nitrogen, a rare gas, or the like, an oxidizing gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidizing atmosphere refers to an atmosphere including an oxidizing gas such as oxygen, ozone, or nitrogen oxide at 10 ppm or higher. The inert gas atmosphere refers to an atmosphere including the oxidizing gas at lower than 10 ppm and is filled with nitrogen or a rare gas.

By the heat treatment, at the same time as the release of the impurities, oxygen contained in the insulating layer 107 is diffused to the oxide semiconductor layer 118a and the oxide semiconductor layer 118b and oxygen vacancies in the oxide semiconductor layer 118a and the oxide semiconductor layer 118b can be reduced. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment may be performed at any time after the oxide semiconductor layer 118a and the oxide semiconductor layer 118b are formed. For example, the heat treatment may be performed after the formation of the oxide semiconductor layer 118a and the oxide semiconductor layer 118b.

The heat treatment is performed at a temperature higher than or equal to 250° C. and lower than or equal to 650° C., preferably higher than or equal to 300° C. and lower than or equal to 500° C. The treatment time is shorter than or equal to 24 hours. Heat treatment for longer than 24 hours is not preferable because the productivity is reduced.

Next, portions of the oxide semiconductor layer 118a and the oxide semiconductor layer 118b are selectively etched using a resist mask, so that the oxide semiconductor layer 108a and the oxide semiconductor layer 108b are formed. By this etching process, the exposed insulating layer 107 is etched slightly, so that the insulating layer 107 in the etched area has a smaller thickness. The etching amount of the insulating layer 107 at this time is preferably greater than or equal to 20% and less than or equal to 80% of the thickness of the insulating layer 107, further preferably greater than or equal to 30% and less than or equal to 70% thereof. In this manner, the insulating layer 107 having a projection can be formed (see FIG. 3B).

Note that the etching of the oxide semiconductor layer 118a, the oxide semiconductor layer 118a, and the insulating layer 107 may be conducted by a dry etching method, a wet etching method, or both of them. After the etching, the resist mask is removed.

Figure 3C:
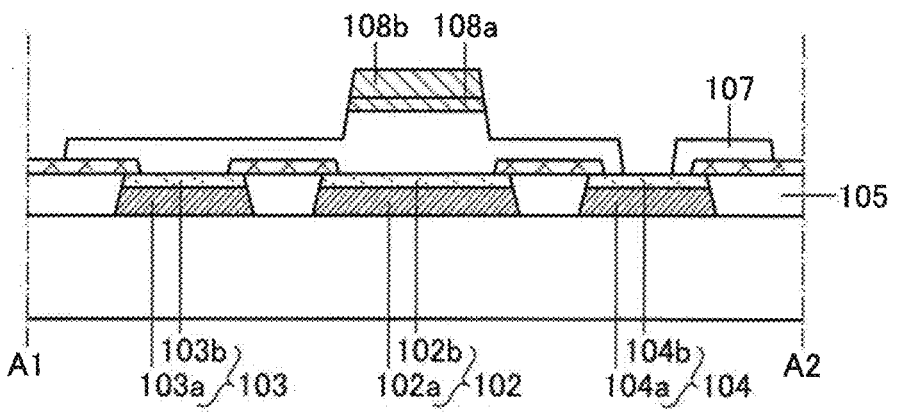

Next, the insulating layer 107 in a region that overlaps with part of the electrode 104b and the insulating layer 107 in a region that overlaps with part of the insulating layer 106 are selectively etched using a resist mask to expose part of the electrode 104b and part of the insulating layer 106 (see FIG. 3C). The insulating layer 107 may be etched by either one or both of a dry etching method and a wet etching method. After the etching, the resist mask is removed.

[B-6: Formation of Electrodes 109 and 119]

Then, a conductive layer for forming the electrode 109 and the electrode 119 is formed over the oxide semiconductor layer 118b and the insulating layer 107 (not illustrated). In this embodiment, as the conductive layer, a 100-nm-thick tungsten layer is formed by a sputtering method.

Next, part of the conductive layer is selectively etched using a resist mask, so that the electrode 109 and the electrode 119 (including other electrodes and wirings formed using the same conductive layer) is formed. The etching of the conductive layer may be performed by a dry etching method, a wet etching method, or both of them. After that, the resist mask is removed (see FIG. 4A).

Note that when a transistor having a very short channel length L is formed, the electrode 109 and the electrode 119 may be formed in such a manner that the resist mask is formed by a method suitable for thin line processing, such as an electron beam exposure, extreme ultraviolet (EUV) exposure, or a liquid immersion exposure and then etching treatment is performed. Note that by the use of a positive type resist for the resist mask, the exposed region can be minimized and throughput can be thus improved. In this manner, a transistor having a channel length of 30 nm or less can be formed.

It is preferable that the electrode 109 and the electrode 119 (including other electrodes and wirings formed using the same conductive layer) each have an end portion having a tapered shaped. Specifically, the edge has a taper angle θ of 80° or less, preferably 60° or less, further preferably 45° or less.

When the cross-section of each of the end portions of the electrode 109 and the electrode 119 (including other electrodes and wirings formed using the same conductive layer) has a step-like shape including a plurality of steps, the coverage with a layer covering the electrode 109 and the electrode 119 can be improved. The above is not limited to the electrode 109 and the electrode 119, and by providing a forward taper shape or a step-like shape for a cross section of the end portion of each layer, a phenomenon in that a layer formed to cover the end portion is cut (disconnection) at the end portion can be prevented, so that the coverage becomes favorable.

[B-7: Formation of Oxide Semiconductor Layer 108c]

Next, an oxide semiconductor layer (not illustrated) for forming the oxide semiconductor layer 108c is formed over the electrode 109, the electrode 119, and the oxide semiconductor layer 108b.

In this embodiment, as the oxide semiconductor layer for forming the oxide semiconductor layer 108c, an In—Ga—Zn oxide film with a thickness of 5 nm is formed using a target with an atomic ratio of In:Ga:Zn=1:3:4.

Figure 4A:
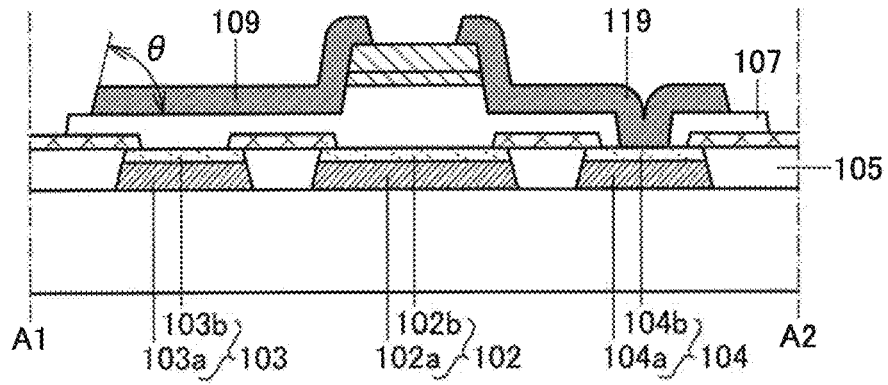
FIGS. 4A to 4C illustrate an example of the manufacturing process of the transistor of one embodiment of the present invention.
Figure 4B:
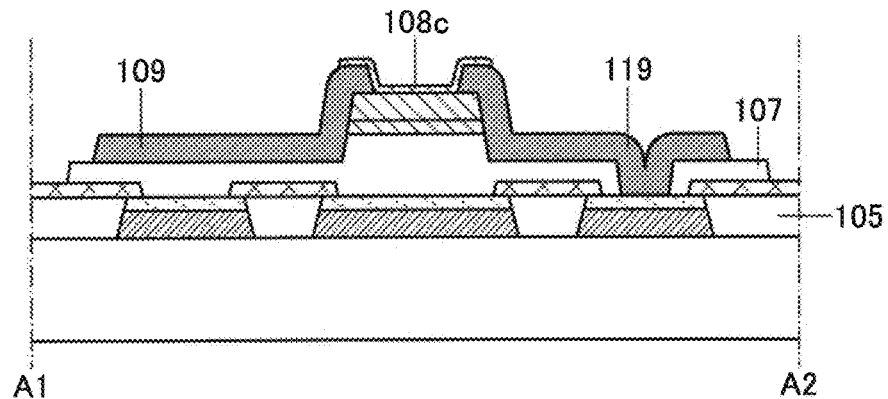
Figure 4C:
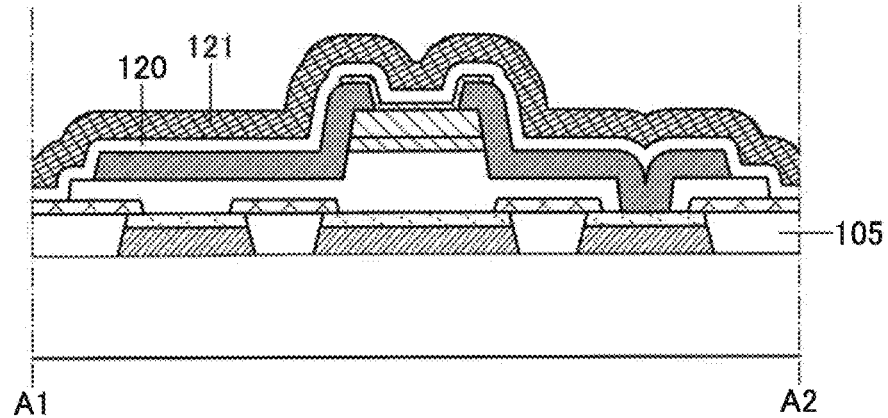
Figure 5A:
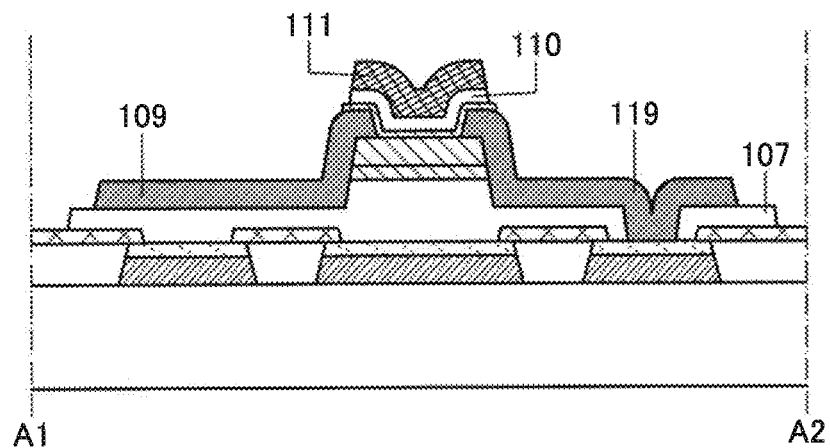
FIGS. 5A and 5B illustrate an example of the manufacturing process of the transistor of one embodiment of the present invention.
Figure 5B:
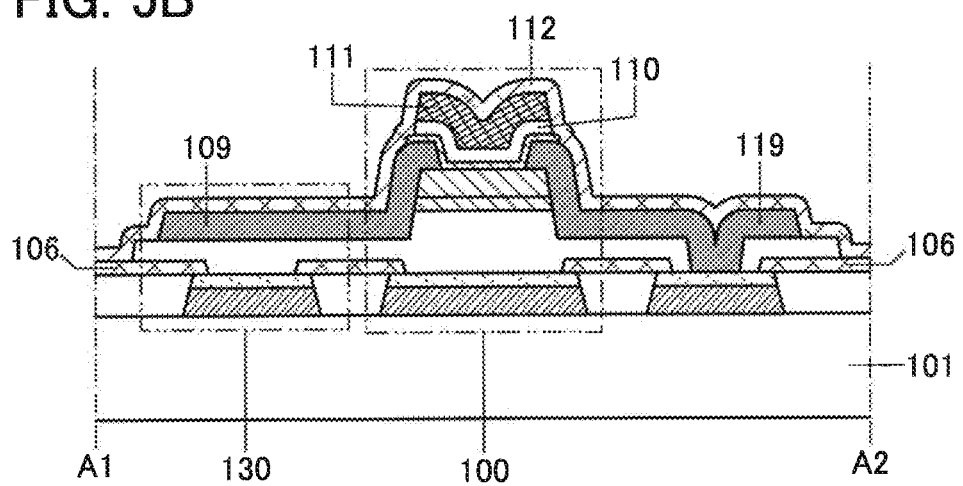

Then, part of the oxide semiconductor layer for forming the oxide semiconductor layer 108c is selectively etched using a resist mask, so that the oxide semiconductor layer 108c is formed (see FIG. 4B).

Note that the etching of the oxide semiconductor layer may be performed by either one or both a dry etching method and a wet etching method. After the etching, the resist mask is removed.

[B-8: Formation of Insulating Layer 110 and Electrode 111]

Then, an insulating layer 120 is formed over the electrode 109, the electrode 119, and the oxide semiconductor layer 108c. The insulating layer 120 can be formed by a sputtering method, a CVD method, an evaporation method, or the like. In this embodiment, as the insulating layer 120, a 20-nm-thick silicon oxynitride film is formed by a plasma CVD method.

Next, a conductive layer 121 is formed over the insulating layer 120. In this embodiment, as the conductive layer 121, a stack including a 30-nm-thick titanium nitride layer and a 135-nm-thick tungsten layer is formed by a sputtering method (see FIG. 4C).

Then, part of the insulating layer 120 and part of the conductive layer 121 are selectively etched using a resist mask, so that the insulating layer 110 and the electrode 111 (including other electrodes and wirings formed using the same conductive layer) are formed. The etching of the insulating layer 120 and the conductive layer 121 may be performed by a dry etching method, a wet etching method, or both of them. After that, the resist mask is removed (see FIG. 5A).

Figure 29:
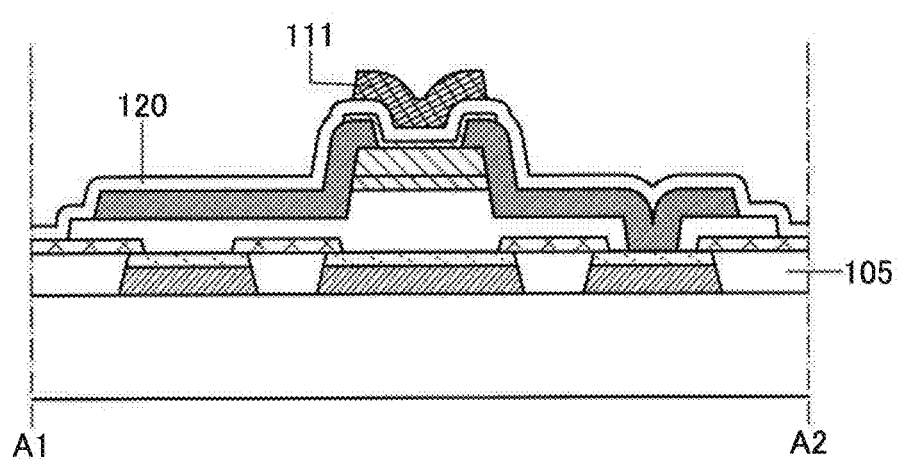
FIG. 29 illustrates an example of a manufacturing process of a transistor of one embodiment of the present invention.
Figure 30A:
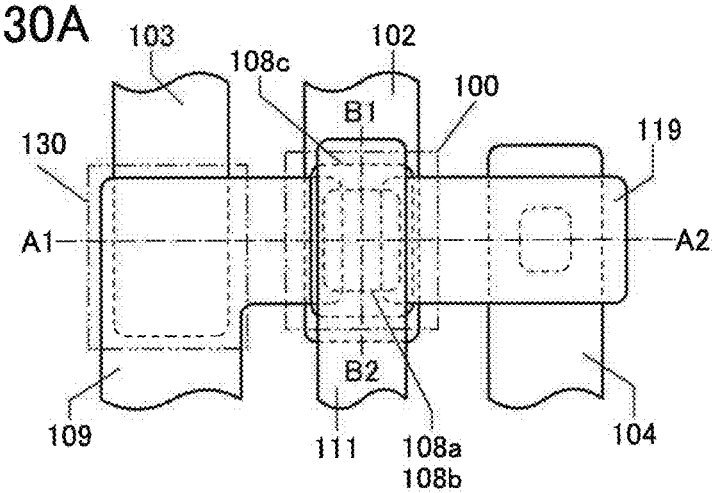
FIGS. 30A to 30C illustrate an example of the transistor and a capacitor according to one embodiment of the present invention.
Figure 30B:
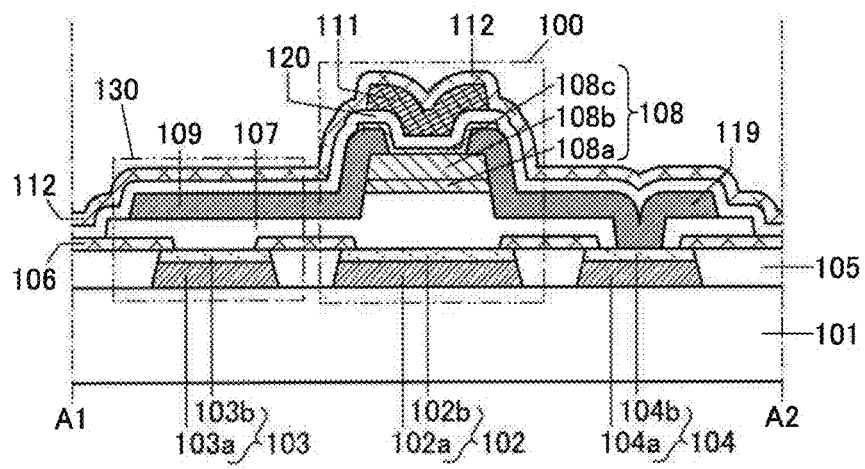
Figure 30C:
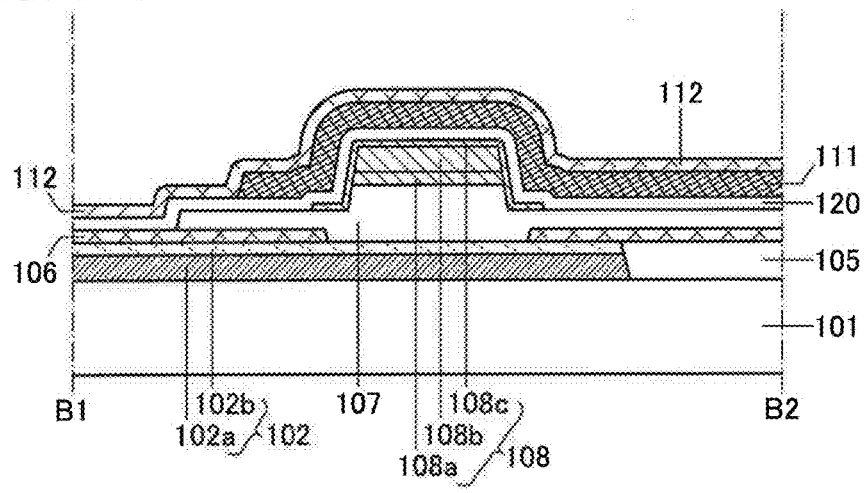

At this time, the insulating layer 120 is not necessarily etched. FIG. 29 illustrates a cross-sectional view of such a case. FIGS. 30A to 30C are a plan view and cross-sectional views illustrating a completed state.

Etching of the insulating layer 120 and the conductive layer 121 may be performed at a time in one etching treatment; alternatively, after etching of the conductive layer 121 is finished, the insulating layer 120 may be etched by a different etching method using the conductive layer 121 as a mask.

With the projection of the insulating layer 107 as illustrated in FIG. 1C, the transistor 100 has a structure in which the oxide semiconductor layer 108b can be electrically surrounded by an electric field of the electrode 111 (a structure of a transistor in which a semiconductor is electrically surrounded by an electric field of a conductive film is referred to as a surrounded channel (s-channel) structure). Therefore, a channel is formed in the entire oxide semiconductor layer 108b (bulk) in some cases. In the s-channel structure, the drain current of the transistor is increased, so that a larger amount of on-state current can be obtained. Furthermore, the entire channel formation region of the oxide semiconductor layer 108b can be depleted by the electric field of the electrode 111. Accordingly, off-state current of the transistor with an s-channel structure can be further reduced.

[B-9: Formation of Insulating Layer 112]

Next, the insulating layer 112 is formed to cover the electrode 109, the electrode 119, and the electrode 111. The insulating layer 112 can be formed by a sputtering method, a CVD method, an evaporation method, or the like. In this embodiment, a 50-nm-thick aluminum oxide layer is formed as the insulating layer 112 by a sputtering method (see FIG. 5B).

Through the above-described steps, the transistor 100 and the capacitor 130 can be manufactured.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more; therefore, a transistor including an oxide semiconductor in a semiconductor layer in which a channel is formed has extremely small leakage current when the transistor is off (also referred to as off-state current). Specifically, the off-state current per micrometer of channel width at room temperature can be lower than $1\times10^{-20}$ A, preferably lower than $1\times10^{-22}$ A, further preferably lower than $1\times10^{-24}$ A. That is, the on/off ratio of the transistor can be greater than or equal to 20 digits and less than or equal to 150 digits.

With one embodiment of the present invention, a transistor with small power consumption can be provided. Accordingly, a semiconductor device with small power consumption can be provided.

This embodiment can be implemented in an appropriate combination with any of the structures described in the other embodiments.

Embodiment 2

In this embodiment, an example of a semiconductor device (memory device) which includes a transistor according to one embodiment of the present invention, which can hold stored data even when not powered, and which has an unlimited number of write cycles will be described with reference to drawings.

Figure 18A:
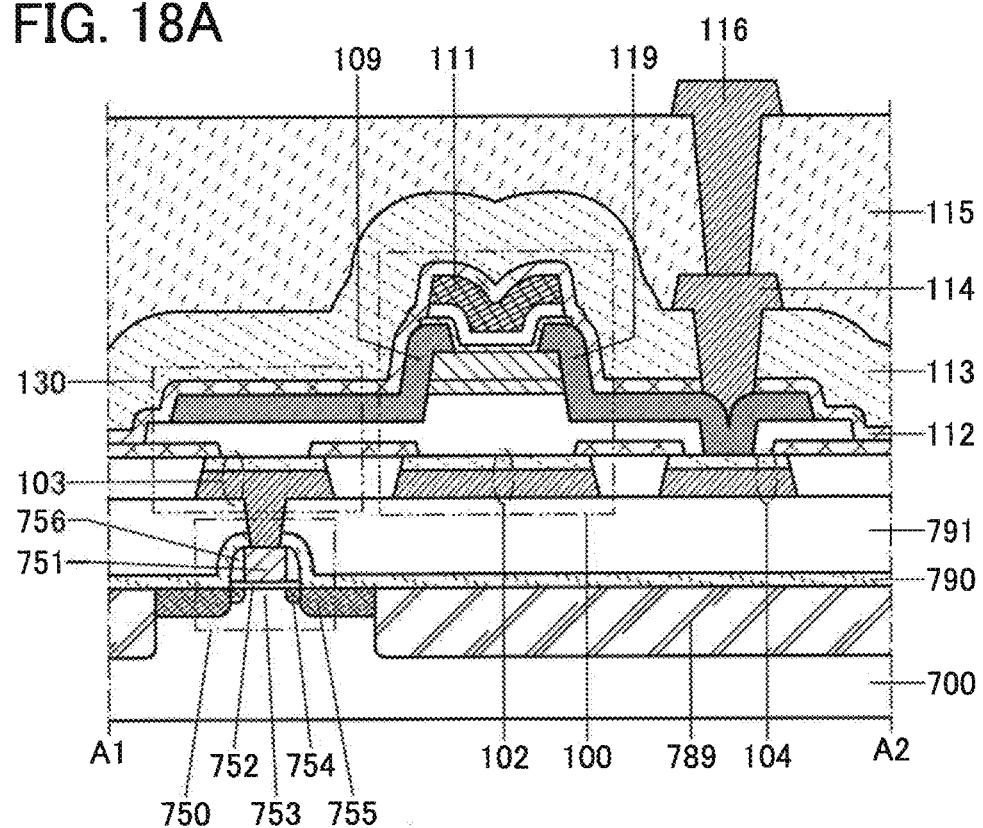
FIGS. 18A and 18B are a cross-sectional view and a circuit diagram illustrating one example of a semiconductor device.
Figure 18B:
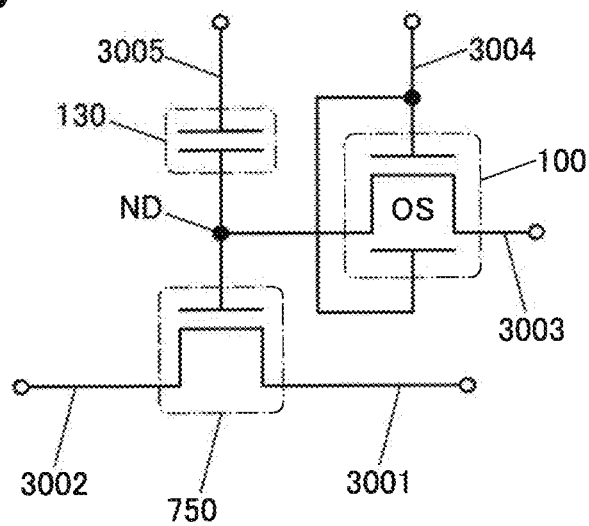

FIG. 18A is a cross-sectional view of a semiconductor device, and FIG. 18B is a circuit diagram of the semiconductor device.

The semiconductor device illustrated in FIGS. 18A and 18B includes a transistor 750 including a substrate 700 in a lower portion, and the transistor 100 including an oxide semiconductor and the capacitor 130 in an upper portion. In the circuit diagram, "OS" is written beside the transistor 100 in order to clearly demonstrate that the transistor 100 includes an oxide semiconductor.

As the substrate 700, a single crystal semiconductor substrate or a polycrystalline semiconductor substrate of silicon or silicon carbide, a compound semiconductor substrate of silicon germanium, a silicon-on-insulator (SOI) substrate, or the like may be used. A transistor manufactured using a semiconductor substrate can operate at high speed easily.

In this embodiment, an example in which a p-type single crystal silicon substrate is used as the substrate 700 is described. The transistor 750 is a transistor whose channel is formed in the substrate 700. The transistor 750 includes a channel formation region 753, n-type impurity regions 754 functioning as lightly doped drain (LDD) regions or extension regions, n-type impurity regions 755 functioning as a source region and a drain region, an insulating layer 752, and an electrode 751. The electrode 751 serves as a gate electrode. The insulating layer 752 serves as a gate insulating layer. The n-type impurity regions 755 have a higher impurity concentration than the n-type impurity regions 754. A side surface of the electrode 751 is provided with a sidewall insulating layer 756. With the use of the electrode 751 and the sidewall insulating layer 756 as masks, the n-type impurity regions 754 and the n-type impurity regions 755 can be formed in a self-aligned manner.

The transistor 750 is separated from other transistors 750 formed on the substrate 700 by an element separation region 789. Further, an insulating layer 790 and an insulating layer 791 are formed over and around the electrode 751 and the sidewall insulating layer 756.

In FIG. 18A, an insulating layer 113 is formed over the transistor 100. The insulating layer 113 can be formed using a material and a method similar to those of the insulating layer 105 described in Embodiment 1. An electrode 114 is formed over the insulating layer 113 and electrically connected to the electrode 119 through an opening formed in the insulating layer 113 and the insulating layer 112.

An insulating layer 115 is formed over the insulating layer 113 and the electrode 114 as a planarization insulating layer. The insulating layer 115 can be formed of a heat-resistant organic material, such as polyimide, acrylic, benzocyclobutene, polyamide, or epoxy. Other than such organic materials, it is possible to use a low-dielectric constant material (a low-k material), a siloxane-based resin, PSG (phosphosilicate glass), BPSG (borophosphosilicate glass), or the like. Note that the insulating layer 115 may be formed by stacking a plurality of insulating films formed using these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. The organic group may include a fluoro group.

There is no particular limitation on the method for forming the insulating layer 115, and any of the following methods which depend on a material thereof can be used: a sputtering method; an SOG method; spin coating; dipping; spray coating; a droplet discharging method (e.g., an ink-jet method); a printing method (e.g., screen printing, or offset printing); or the like. When the baking step of the insulating layer 115 also serves as heat treatment for another layer, a semiconductor device can be manufactured efficiently.

The insulating layer 115 may be formed using a material and a method similar to those of the insulating layer 105 described in Embodiment 1 and then may be subjected to CMP treatment.

An electrode 116 is formed over the insulating layer 115 and electrically connected to the electrode 114 through an opening formed in the insulating layer 115.

The electrode 751 is electrically connected to the electrode 103. One of the n-type impurity regions 755 in the transistor 750 is electrically connected to a wiring 3001, and the other thereof is electrically connected to a wiring 3002 (not illustrated). Furthermore, the electrode 119 is electrically connected to a wiring 3003, the electrode 109 is electrically connected to a wiring 3005 through the capacitor 130, and the electrode 111 and the electrode 102 are electrically connected to a wiring 3004 (not illustrated).

Here, a material of a semiconductor layer including a channel formation region of the transistor 750 and a material of a semiconductor layer including a channel formation region of the transistor 100 are preferably materials having different band gaps. For example, in the case where an oxide semiconductor is used in the semiconductor layer including a channel formation region of the transistor 100, a semiconductor material other than an oxide semiconductor is preferably used in the semiconductor layer including a channel formation region of the transistor 750. A transistor including a semiconductor material other than an oxide semiconductor, such as crystalline silicon, can operate at high speed more easily than a transistor including an oxide semiconductor. A transistor including an oxide semiconductor enables charges to be held for a long time owing to its electrical characteristics, that is, the low off-state current.

A transistor including crystalline silicon in a semiconductor layer in which a channel is formed can operate at higher speed than a transistor including an oxide semiconductor in a semiconductor layer in which a channel is formed. By using this transistor as a reading transistor, data can be read at high speed.

Although both of the above transistors are n-channel transistors in the following description, it is needless to say that p-channel transistors can be used. Note that unless otherwise specified, the specific structure of the semiconductor device, such as a material used for the semiconductor device and the structure of the semiconductor device, need not be limited to that described here.

The transistor 100 and the capacitor 130 can be formed over the substrate over which the transistor 750 is formed as illustrated in FIG. 18A, which enables a higher degree of integration of the semiconductor device.

FIG. 18B is a circuit diagram of the semiconductor device illustrated in FIG. 18A. In FIG. 18B, the wiring 3001 is electrically connected to a source electrode of the transistor 750. The wiring 3002 is electrically connected to a drain electrode of the transistor 750. The wiring 3003 is electrically connected to one of the source electrode and the drain electrode of the transistor 100. The wiring 3004 is electrically connected to the gate electrode of the transistor 100. The gate electrode of the transistor 750, the other of the source electrode and the drain electrode of the transistor 100, and one electrode of the capacitor 130 are electrically connected to a node ND. The wiring 3005 is electrically connected to the other electrode of the capacitor 130.

A transistor including an oxide semiconductor in a semiconductor layer in which a channel is formed has an extremely small off-state current. Since the transistor including an oxide semiconductor in a semiconductor layer in which a channel is formed is used as the transistor 100, electric charges in the node ND can be retained for a long time. Thus, electric charges in the gate electrode of the transistor 750 can be retained for a long time.

By utilizing a feature that electric charges in the gate electrode of the transistor 750 can be retained, the semiconductor device in FIG. 18B can perform writing, retaining, and reading of data in the following manner.

Writing and retaining of data are described. First, the potential of the wiring 3004 is set to a potential at which the transistor 100 is turned on, so that the transistor 100 is turned on. Accordingly, the potential of the wiring 3003 is supplied to the gate electrode of the transistor 750 and the capacitor 130. That is, a predetermined charge is supplied to the gate electrode of the transistor 750 (writing). Here, one of two kinds of charges providing different potential levels (hereinafter referred to as a low-level charge and a high-level charge) is supplied. After that, the potential of the wiring 3004 is set to a potential at which the transistor 100 is turned off, so that the transistor 100 is turned off. Thus, the charge supplied to the gate electrode of the transistor 750 is retained (retaining).

Since the off-state current of the transistor 100 is extremely low, the charge of the gate electrode of the transistor 750 is retained for a long time.

Next, reading of data is described. An appropriate potential (a reading potential) is supplied to the wiring 3005 while a predetermined potential (a constant potential) is supplied to the first wiring 3001, whereby the potential of the wiring 3002 varies depending on the amount of charge retained in the gate electrode of the transistor 750. This is because in general, in the case of using an n-channel transistor as the transistor 750, an apparent threshold voltage $V_{th\_H}$ at the time when the high-level charge is given to the gate electrode of the transistor 750 is lower than an apparent threshold voltage $V_{th\_L}$ at the time when the low-level charge is given to the gate electrode of the transistor 750. Here, an apparent threshold voltage refers to the potential of the wiring 3005 which is needed to turn on the transistor 750. Thus, the potential of the wiring 3005 is set to a potential $V_0$ which is between $V_{th\_H}$ and $V_{th\_L}$, whereby charge supplied to the gate electrode of the transistor 750 can be determined. For example, in the case where the high-level charge is supplied in writing and the potential of the wiring 3005 is $V_0$ ($>V_{th\_H}$), the transistor 750 is turned on. In the case where the low-level charge is supplied in writing, even when the potential of the wiring 3005 is $V_0$ ($<V_{th\_L}$), the transistor 750 remains off. Thus, the data retained in the gate electrode can be read by determining the potential of the wiring 3002.

Note that in the case where memory cells are arrayed, it is necessary that only data of a desired memory cell be able to be read. The wiring 3005 in the case where data is not read may be supplied with a potential at which the transistor 750 is turned off regardless of the state of the gate electrode, that is, a potential lower than $V_{th\_H}$. Alternatively, the wiring 3005 may be supplied with a potential at which the transistor 750 is turned on regardless of the state of the gate electrode, that is, a potential higher than $V_{th\_L}$.

When including a transistor having a channel formation region formed using an oxide semiconductor and having an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film does not occur. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

As described above, a miniaturized and highly integrated semiconductor device having high electrical characteristics can be provided.

This embodiment can be combined as appropriate with any of the other embodiments in this specification.

Embodiment 3

Figure 19:
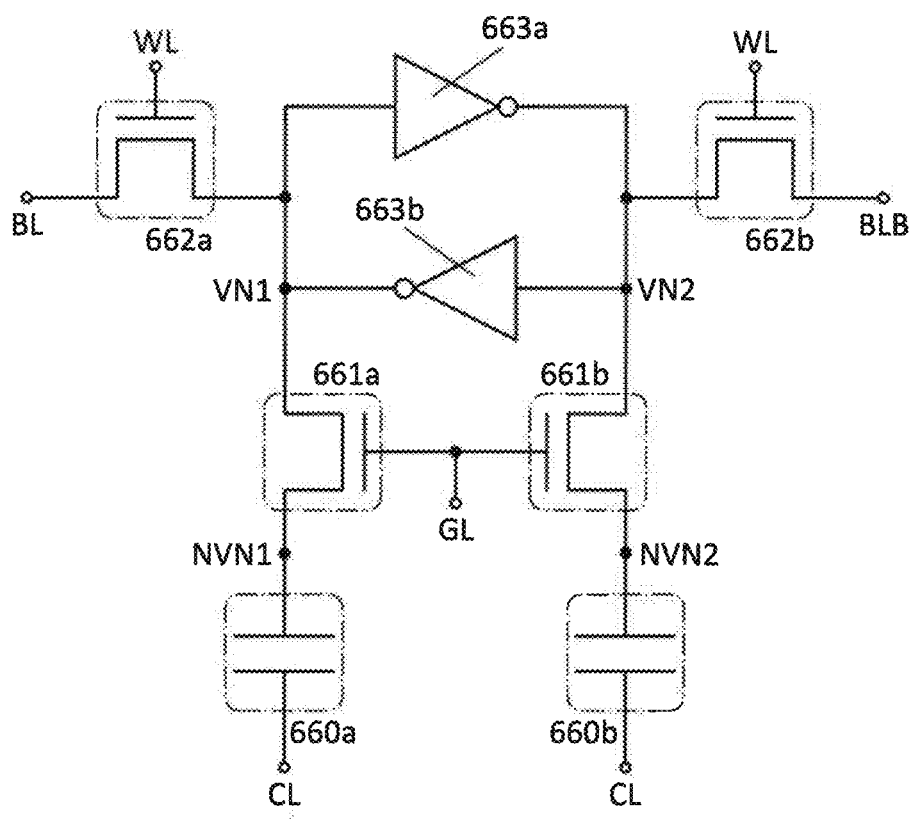
FIG. 19 is a circuit diagram illustrating an example of a semiconductor device of one embodiment of the present invention.

In this embodiment, an example of a semiconductor device including a transistor of one embodiment of the present invention is described with reference to drawings. FIG. 19 is an example of a circuit diagram of a semiconductor device of one embodiment of the present invention.

The semiconductor device in FIG. 19 includes a capacitor 660a, a capacitor 660b, a transistor 661a, a transistor 661b, a transistor 662a, a transistor 662b, an inverter 663a, an inverter 663b, a wiring BL, a wiring BLB, a wiring WL, a wiring CL, and a wiring GL.

The semiconductor device in FIG. 19 is a memory cell in which the inverter 663a and the inverter 663b are connected in a ring to form a flip-flop. A node to which an output signal of the inverter 663b is output is a node VN1, and a node to which an output signal of the inverter 663a is output is a node VN2. The memory cells are provided in a matrix, whereby a memory device (memory cell array) can be formed.

One of a source and a drain of the transistor 662a is electrically connected to the wiring BL, the other of the source and the drain thereof is electrically connected to the node VN1, and a gate thereof is electrically connected to the wiring WL. One of a source and a drain of the transistor 662b is electrically connected to the node VN2, the other of the source and the drain thereof is electrically connected to the wiring BLB, and a gate thereof is electrically connected to the wiring WL.

One of a source and a drain of the transistor 661a is electrically connected to the node VN1, the other of the source and the drain thereof is electrically connected to one of electrodes of the capacitor 660a, and a gate thereof is electrically connected to the wiring GL. A node between the other of the source and the drain of the transistor 661a and the one of electrodes of the capacitor 660a is a node NVN1. One of a source and a drain of the transistor 661b is electrically connected to the node VN2, the other of the source and the drain thereof is electrically connected to one of electrodes of the capacitor 660b, and a gate thereof is electrically connected to the wiring GL. A node between the other of the source and the drain of the transistor 661b and the one of electrodes of the capacitor 660b is a node NVN2.

The other of electrodes of the capacitor 660a is electrically connected to the wiring CL. The other of electrodes of the capacitor 660b is electrically connected to the wiring CL.

Conduction and non-conduction states of the transistor 662a and the transistor 662b can be controlled by a potential supplied to the wiring WL. Conduction and non-conduction states of the transistor 661a and the transistor 661b can be controlled by a potential supplied to the wiring GL.

Writing, retaining, and reading operation of the memory cell illustrated in FIG. 19 will be described below.

In the case where data is written, first, potentials corresponding to data 0 or data 1 are applied to the wiring BL and the wiring BLB.

For example, in the case where data 1 is to be written, a high-level power supply potential (VDD) is applied to the wiring BL and a ground potential is applied to the wiring BLB. Then, a potential (VH) higher than or equal to the sum of VDD and the threshold voltage of the transistors 662a and 662b is applied to the wiring WL.

Next, the potential of the wiring WL is set to be lower than the threshold voltage of the transistors 662a and 662b, whereby the data 1 written to the flip-flop is retained.

In the case where the data is read, first, the wiring BL and the wiring BLB are set to VDD in advance. Then, VH is applied to the wiring WL. Accordingly, the potential of the wiring BL remains VDD, but the potential of the wiring BLB is discharged through the transistor 662a and the inverter 663a to be a ground potential. The potential difference between the wiring BL and the wiring BLB is amplified by a sense amplifier (not illustrated), so that the retained data 1 can be read.

In the case where data 0 is to be written, the wiring BL is set to a ground potential and the wiring BLB is set to VDD; then, VH is applied to the wiring WL. Next, the potential of the wiring WL is set to be lower than the threshold voltage of the transistors 662a and 662b, whereby the data 0 written to the flip-flop is retained. In the case of data reading, the wiring BL and the wiring BLB are set to VDD in advance and VH is applied to the wiring WL, whereby the potential of the wiring BLB remains VDD but the potential of the wiring BL is discharged through the transistor 662b and the inverter 663b to be a ground potential. The potential difference between the wiring BL and the wiring BLB is amplified by the sense amplifier, so that the retained data 0 can be read.

Accordingly, the semiconductor device in FIG. 19 serves as a so-called static random access memory (SRAM). An SRAM does not require refresh operation because the SRAM retains data using a flip-flop. Therefore, power consumption in retaining data can be reduced. In addition, an SRAM does not require a capacitor in a flip-flop and is therefore suitable for applications where high speed operation is required.

In the semiconductor device in FIG. 19, data of the node VN1 can be written to the node NVN1 through the transistor 661a. Similarly, data of the node VN2 can be written to the node NVN2 through the transistor 661b. The written data is retained by turning off the transistor 661a or the transistor 661b. For example, even in the case where supply of a power supply potential is stopped, data of the node VN1 and the node VN2 can be retained in some cases.

Unlike a conventional SRAM in which data is lost immediately after supply of a power supply potential is stopped, the semiconductor device in FIG. 19 can retain data even after supply of a power supply potential is stopped. Therefore, power consumption of the semiconductor device can be reduced by appropriately stopping the supply of a power supply potential. For example, the semiconductor device in FIG. 19 is used in a memory region of a CPU, whereby power consumption of the CPU can be reduced.

Note that the length of a period during which data is retained in the node NVN1 and the node NVN2 depends on the off-state current of the transistor 661a and the transistor 661b. Therefore, a transistor with small off-state current is preferably used as each of the transistor 661a and the transistor 661b in order to retain data for a long time. Alternatively, the capacitance of the capacitor 660a and the capacitor 660b is preferably increased.

For example, the transistor 100 and the capacitor 130 described in Embodiment 1 are used as the transistor 661a and the capacitor 660a, whereby data can be retained in the node NVN1 for a long time. Similarly, the transistor 100 and the capacitor 130 are used as the transistor 661b and the capacitor 660b, whereby data can be retained in the node NVN2 for a long time. Accordingly, the description of the transistor 100 is referred to for the transistor 661a and the transistor 661b. Furthermore, the description of the capacitor 130 is referred to for the capacitor 660a and the capacitor 660b.

As described in the above embodiment, the transistor 100 and the capacitor 130 can be formed to at least partly overlap with the transistor 750. The transistor 662a, the transistor 662b, a transistor included in the inverter 663a, and a transistor included in the inverter 663b in FIG. 19 can be formed to overlap with at least part of any of the transistor 661a, the transistor 661b, the capacitor 660a, and the capacitor 660b. Accordingly, the semiconductor device in FIG. 19 can be formed without a significant increase in an occupation area in some cases as compared to a conventional SRAM. The description of the transistor 750 is referred to for the transistor 662a, the transistor 662b, the transistor included in the inverter 663a, and the transistor included in the inverter 663b.

As described above, the semiconductor device of one embodiment of the present invention has high performance for an occupation area. Furthermore, the semiconductor device can be manufactured with high productivity.

This embodiment can be combined as appropriate with any of the other embodiments in this specification.

Embodiment 4

In this embodiment, an example of a semiconductor device including a transistor of one embodiment of the present invention will be described. Note that in this embodiment, a CPU is described as an example of a semiconductor device of one embodiment of the present invention.

Figure 20:
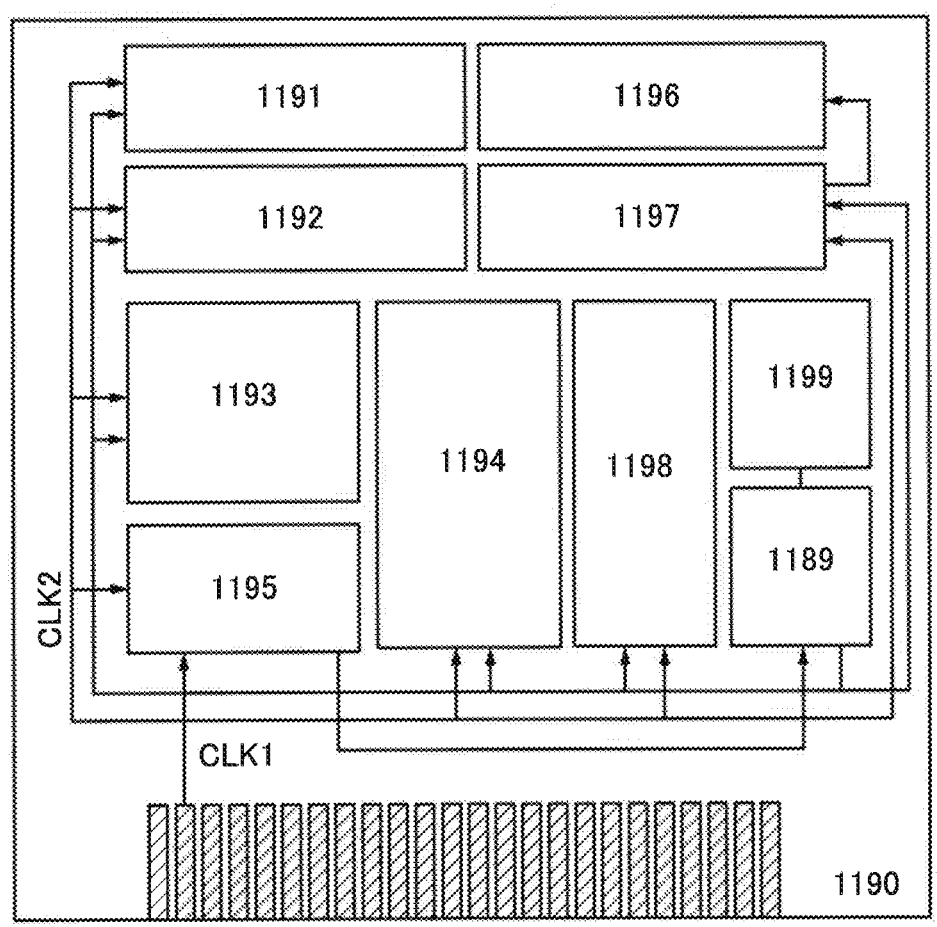
FIG. 20 is a block diagram illustrating an example of a semiconductor device.

FIG. 20 is a block diagram illustrating a configuration example of a CPU including at least a transistor of one embodiment of the present invention.

The CPU illustrated in FIG. 20 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (Bus I/F), a rewritable ROM 1199, and a ROM interface 1189 (ROM I/F). A semiconductor substrate, an SOI substrate, a glass substrate, or the like is used as the substrate 1190. The ROM 1199 and the ROM interface 1189 may be provided over a separate chip. Needless to say, the CPU in FIG. 20 is just an example in which the configuration has been simplified, and an actual CPU may have a variety of configurations depending on the application. For example, the CPU may have the following configuration: a structure including the CPU illustrated in FIG. 20 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 in accordance with a reference clock signal CLK1, and supplies the internal clock signal CLK2 to the above circuits.

In the CPU illustrated in FIG. 20, a memory cell is provided in the register 1196. For the memory cell of the register 1196, any of the transistors described in the above embodiments can be used.

In the CPU illustrated in FIG. 20, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 21:
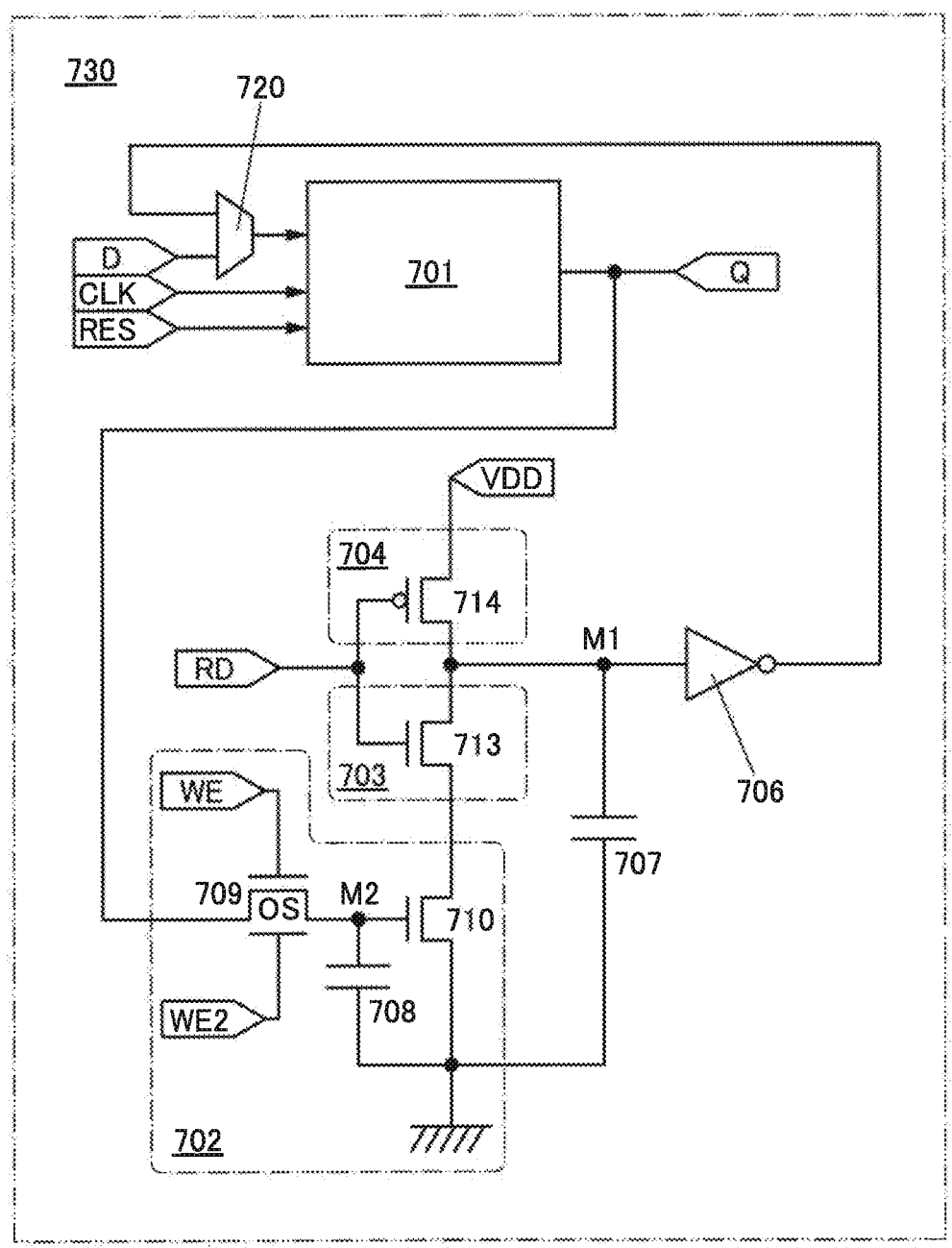
FIG. 21 is a circuit diagram illustrating one example of a memory device.

FIG. 21 is an example of a circuit diagram of a memory element that can be used as the register 1196. A memory element 730 includes a circuit 701 in which stored data is volatile when power supply is stopped, a circuit 702 in which stored data is nonvolatile even when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 730 may further include another element such as a diode, a resistor, or an inductor, as needed.

Here, the memory device described in the above embodiment can be used as the circuit 702. When supply of a power supply voltage to the memory element 730 is stopped, a ground potential (0 V) or a potential at which the transistor 709 in the circuit 702 is turned off continues to be input to a gate of the transistor 709. For example, the gate of the transistor 709 is grounded through a load such as a resistor.

Shown here is an example in which the switch 703 is a transistor 713 having one conductivity type (e.g., an n-channel transistor) and the switch 704 is a transistor 714 having a conductivity type opposite to the one conductivity type (e.g., a p-channel transistor). A first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 708 can be supplied with the low power supply potential (e.g., GND) or the high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the gate of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 701 is input to the other of the source and the drain of the transistor 709. FIG. 21 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 21, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where the circuit 701 includes a node in which a signal obtained by inversion of the logic value of a signal input from the input terminal is retained, the signal output from the second terminal of the switch 703 (the other of the source and the drain of the transistor 713) can be input to the node.

As the transistor 709 in FIG. 21, the transistor 100 described in Embodiment 1 can be used. The control signal WE can be input to a gate electrode and the control signal WE2 can be input to a back gate electrode. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and Icut of the transistor 709 can be further reduced. Note that as the transistor 709, the transistor without the back gate electrode can be used.

In FIG. 21, the transistors included in the memory element 730 except for the transistor 709 can each be a transistor in which a channel is formed in a layer formed using a semiconductor other than an oxide semiconductor or in the substrate 1190. For example, a channel of the transistor can be formed in a silicon layer or a silicon substrate. Alternatively, all the transistors in the memory element 730 may be a transistor in which a channel is formed in an oxide semiconductor layer. Further alternatively, in the memory element 730, a transistor in which a channel is formed in an oxide semiconductor layer can be included besides the transistor 709, and a transistor in which a channel is formed in a layer including a semiconductor other than an oxide semiconductor or the substrate 1190 can be used for the rest of the transistors.

As the circuit 701 in FIG. 21, for example, a flip-flop circuit can be used. As the logic element 706, for example, an inverter, a clocked inverter, or the like can be used.

In a period during which the memory element 730 is not supplied with the power supply voltage, the semiconductor device of one embodiment of the present invention can retain data stored in the circuit 701 by the capacitor 708 which is provided in the circuit 702.

The off-state current of the transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when such a transistor including an oxide semiconductor is used for the transistor 709, a signal held in the capacitor 708 is retained for a long time also in a period during which the power supply voltage is not supplied to the memory element 730. The memory element 730 can thus retain the stored content (data) also in a period during which the supply of the power supply voltage is stopped.

The memory element 730 performs pre-charge operation with the switch 703 and the switch 704, shortening the time required for the circuit 701 to retain original data again after the supply of the power supply voltage is restarted.

In the circuit 702, a signal retained by the capacitor 708 is input to the gate of the transistor 710. Therefore, after supply of the power supply voltage to the memory element 730 is restarted, the signal retained by the capacitor 708 can be converted into the one corresponding to the state (the on state or the off state) of the transistor 710 to be read from the circuit 702. Consequently, an original signal can be accurately read even when a potential corresponding to the signal retained by the capacitor 708 varies to some degree.

By using the above-described memory element 730 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 730 is used in a CPU in this embodiment, the memory element 730 can also be used in an LSI such as a digital signal processor (DSP), a custom LSI, or a programmable logic device (PLD), and a radio frequency (RF).

This embodiment can be combined as appropriate with any of the other embodiments in this specification.

Embodiment 5

In this embodiment, an example of a semiconductor device including a transistor of one embodiment of the present invention will be described. Note that in this embodiment, a semiconductor device of one embodiment of the present invention will be described taking an RF tag as an example.

The RF tag of one embodiment of the present invention includes a memory circuit, stores data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have high reliability in order to be used for this purpose.

Figure 22:
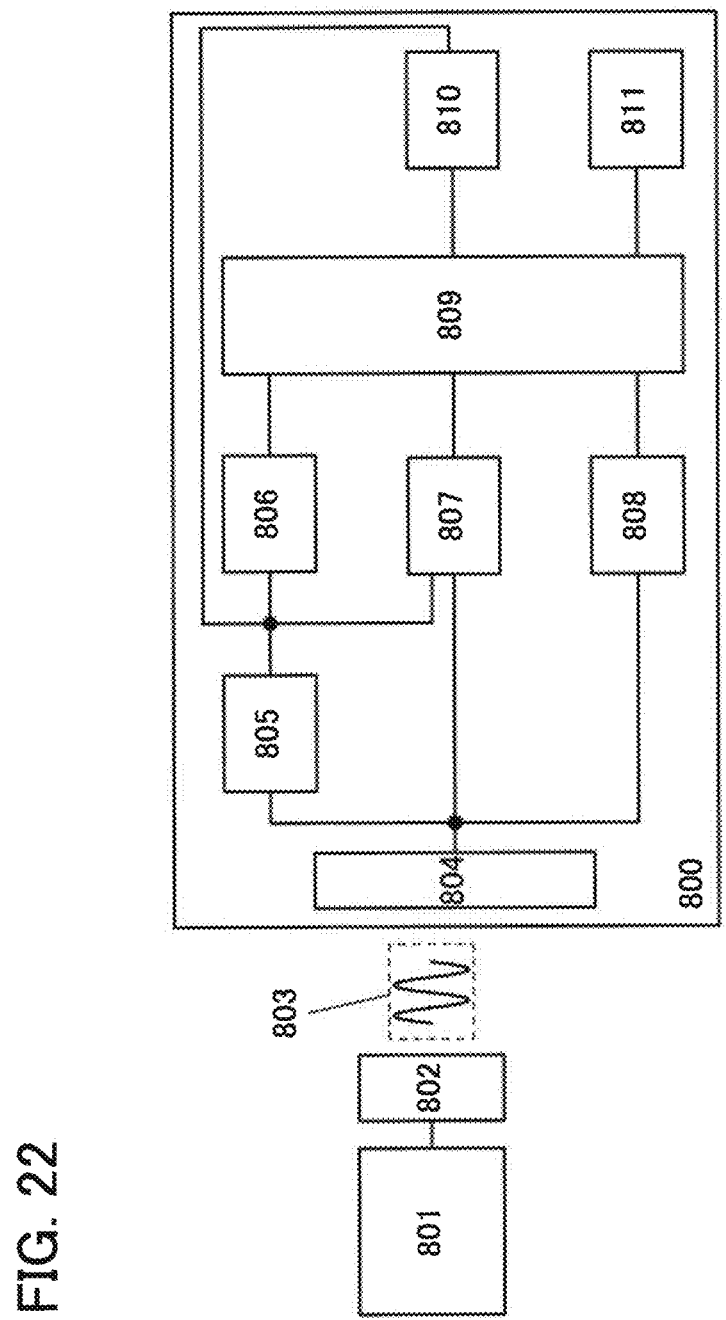
FIG. 22 is a block diagram of an RF tag of one embodiment of the present invention.
Figure 23A:
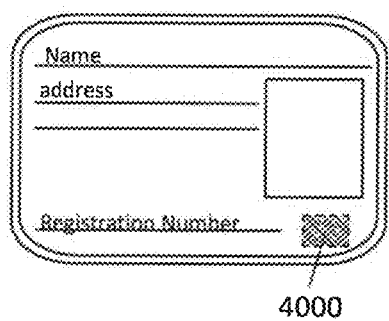
FIGS. 23A to 23F show application examples of an RF tag of one embodiment of the present invention.
Figure 23B:
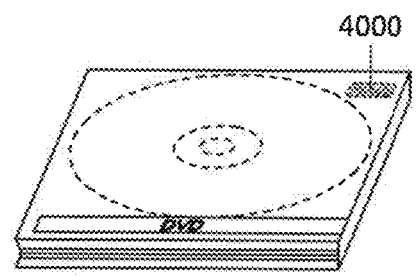
Figure 23C:
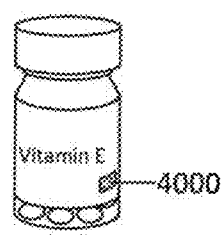
Figure 23D:
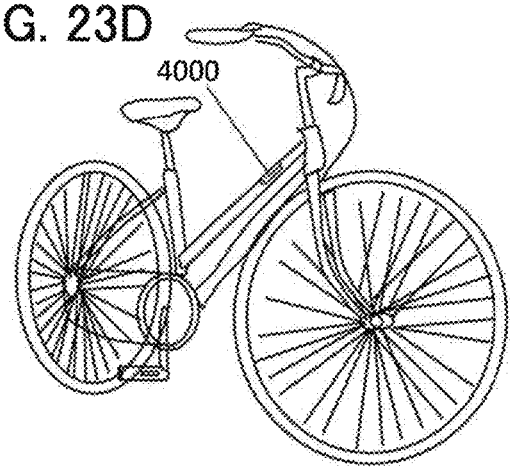
Figure 23E:
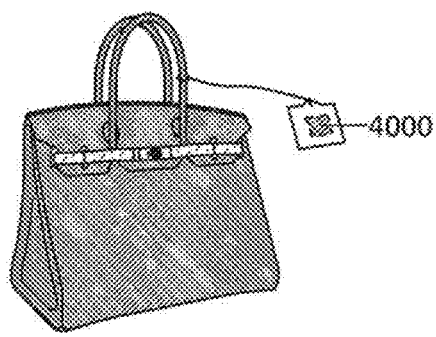
Figure 23F:
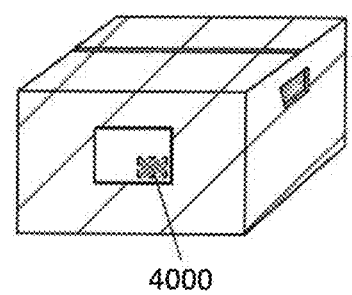

A configuration of the RF tag will be described with reference to FIG. 22. FIG. 22 is a block diagram illustrating a configuration example of an RF tag.

As shown in FIG. 22, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function included in the demodulation circuit 807 may be a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that the decision whether each circuit described above is provided or not can be made as appropriate.

Here, the semiconductor device described in the above embodiment can be used as the memory circuit 810. Since the memory device of one embodiment of the present invention can retain data even when not powered, the memory device is suitable for an RF tag. Furthermore, the memory device of one embodiment of the present invention needs power (voltage) needed for data writing lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

Application examples of the RF tag of one embodiment of the present invention are shown below with reference to FIGS. 23A to 23F. The RF tag is widely used and can be provided for, for example, products such as bills, coins, securities, bearer bonds, documents (e.g., driver's licenses or resident's cards, see FIG. 23A), packaging containers (e.g., wrapping paper or bottles, see FIG. 23C), recording media (e.g., DVD software or video tapes, see FIG. 23B), vehicles (e.g., bicycles, see FIG. 23D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 23E and 23F).

An RF tag 4000 of one embodiment of the present invention is fixed to products by being attached to a surface thereof or embedded therein. For example, the RF tag 4000 is fixed to each product by being embedded in paper of a book, or embedded in an organic resin of a package. The RF tag 4000 of one embodiment of the present invention is small, thin, and lightweight, so that the design of a product is not impaired even after the RF tag 4000 of one embodiment of the present invention is fixed thereto. Furthermore, bills, coins, securities, bearer bonds, documents, or the like can have identification functions by being provided with the RF tag 4000 of one embodiment of the present invention, and the identification functions can be utilized to prevent counterfeits. Moreover, the efficiency of a system such as an inspection system can be improved by providing the RF tag 4000 of one embodiment of the present invention for packaging containers, recording media, personal belongings, foods, clothing, household goods, electronic devices, or the like. Vehicles can also have higher security against theft or the like by being provided with the RF tag 4000 of one embodiment of the present invention.

As described above, the RF tag of one embodiment of the present invention can be used for the above-described purposes.

This embodiment can be combined as appropriate with any of the other embodiments in this specification.

Embodiment 6

In this embodiment, an example of a semiconductor device that is one embodiment of the present invention is described with reference to drawings. In this embodiment, a semiconductor device of one embodiment of the present invention is described taking a display device as an example.

Figure 24A:
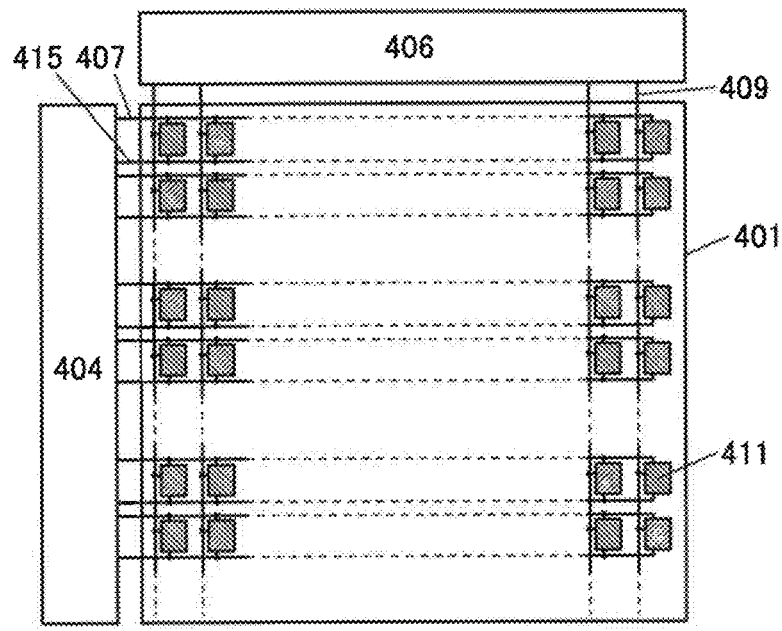
FIGS. 24A to 24C are a block diagram and circuit diagrams illustrating one embodiment of a semiconductor device.

FIG. 24A illustrates an example of a display device. The display device in FIG. 24A includes a pixel portion 401, a scan line driver circuit 404, a signal line driver circuit 406, m scan lines 407 that are arranged parallel or substantially parallel to each other and whose potentials are controlled by the scan line driver circuit 404, and n signal lines 409 that are arranged parallel or substantially parallel to each other and whose potentials are controlled by the signal line driver circuit 406. Furthermore, the pixel portion 401 includes a plurality of pixels 411 arranged in a matrix.

By using three pixels 411 as one pixel, color display can be performed. For example, color display can be performed by operating the pixel 411 for emitting red light, the pixel 411 for emitting green light, and the pixel 411 for emitting blue light as one pixel. The colors of light emitted from the three pixels 411 may be yellow, cyan, magenta, and the like instead of red, green, and blue.

Alternatively, four pixels 411 may be used as one pixel. For example, the four pixels 411 may emit red light, green light, blue light, and yellow light. By increasing the number of pixels 411 used as one pixel, the reproducibility of halftones can be particularly improved. Thus, the display quality of the display device can be improved. In another example, the four pixels 411 may emit red light, green light, blue light, and white light. With the pixel 411 that emits white light, the luminance of the display region can be increased. Depending on the intended use of the display device, the two pixels 411 can be used as one pixel.

Furthermore, the display device illustrated in FIG. 24A includes capacitor lines 415 arranged parallel or substantially parallel to each other along the scan lines 407. Note that the capacitor lines 415 may be arranged parallel or substantially parallel to each other along the signal lines 409. The scan line driver circuit 404 and the signal line driver circuit 406 are collectively referred to as a driver circuit portion in some cases.

Each scan line 407 is electrically connected to the n pixels 411 in the corresponding row among the pixels 411 arranged in m rows and n columns in the pixel portion 401. Each signal line 409 is electrically connected to the m pixels 411 in the corresponding column among the pixels 411 arranged in m rows and n columns. Note that m and n are each an integer of 1 or more. Each capacitor line 415 is electrically connected to the n pixels 411 in the corresponding row among the pixels 411 arranged in m rows and n columns. Note that in the case where the capacitor lines 415 are arranged parallel or substantially parallel to each other along the signal lines 409, each capacitor line 415 is electrically connected to the m pixels 411 in the corresponding column among the pixels 411 arranged in m rows and n columns.

Figure 24B:
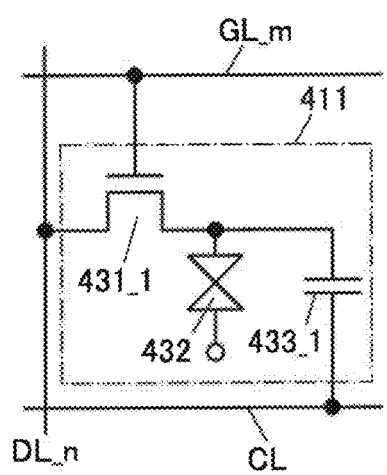
Figure 24C:
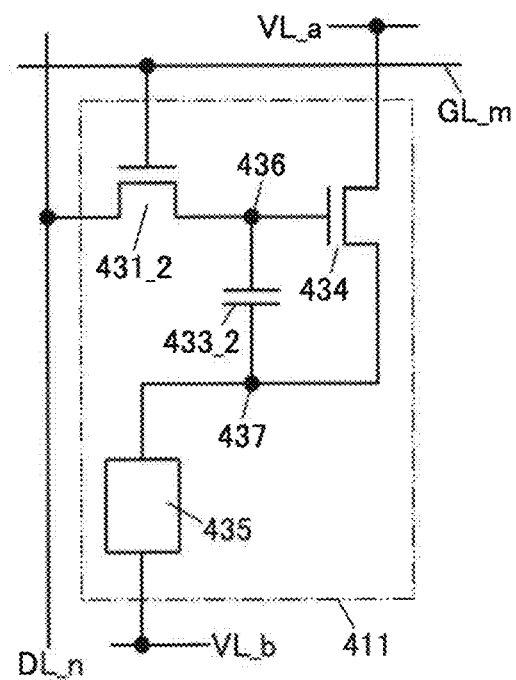

FIGS. 24B and 24C illustrate circuit configurations that can be used for the pixels 411 in the display device illustrated in FIG. 24A.

The pixel 411 illustrated in FIG. 24B includes a liquid crystal element 432, a transistor 431_1, and a capacitor 433_1. As the transistor 431_1, the transistor 100 disclosed in the above embodiment can be used.

The potential of one of a pair of electrodes of the liquid crystal element 432 is set according to the specifications of the pixels 411 as appropriate. The alignment state of the liquid crystal element 432 depends on written data. A common potential may be applied to one of the pair of electrodes of the liquid crystal element 432 included in each of the plurality of pixels 411. Furthermore, the potential supplied to one of a pair of electrodes of the liquid crystal element 432 in the pixel 411 in one row may be different from the potential supplied to one of a pair of electrodes of the liquid crystal element 432 in the pixel 411 in another row.

As examples of a driving method of the display device including the liquid crystal element 432, any of the following modes can be given: a TN mode, an STN mode, a VA mode, an ASM (axially symmetric aligned micro-cell) mode, an OCB (optically compensated birefringence) mode, an FLC (ferroelectric liquid crystal) mode, an AFLC (anti-ferroelectric liquid crystal) mode, an MVA mode, a PVA (patterned vertical alignment) mode, an IPS mode, an FFS mode, a TBA (transverse bend alignment) mode, and the like. Other examples of the driving method of the display device include ECB (electrically controlled birefringence) mode, PDLC (polymer dispersed liquid crystal) mode, PNLC (polymer network liquid crystal) mode, and a guest-host mode. Note that the present invention is not limited to this, and various liquid crystal elements and driving methods can be used as a liquid crystal element and a driving method thereof.

The liquid crystal element may be formed using a liquid crystal composition including liquid crystal exhibiting a blue phase and a chiral material. The liquid crystal exhibiting a blue phase has a short response time of 1 ms or less. Further, the liquid crystal is optically isotropic, which makes the alignment process unneeded and the viewing angle dependence small.

In the pixel 411 in the m-th row and the n-th column, one of a source electrode and a drain electrode of the transistor 431_1 is electrically connected to a signal line DL_n, and the other is electrically connected to the other of a pair of electrodes of the liquid crystal element 432. A gate electrode of the transistor 431_1 is electrically connected to a scan line GL_m. The transistor 431_1 has a function of controlling whether to write a data signal by being turned on or off.

One of a pair of electrodes of the capacitor 433_1 is electrically connected to a wiring to which a potential is supplied (hereinafter referred to as a capacitor line CL), and the other is electrically connected to the other of the pair of electrodes of the liquid crystal element 432. The potential of the capacitor line CL is set in accordance with the specifications of the pixel 411 as appropriate. The capacitor 433_1 functions as a storage capacitor for storing written data.

For example, in the display device including the pixel 411 in FIG. 24B, the pixels 411 are sequentially selected row by row by the scan line driver circuit 404, whereby the transistors 431_1 are turned on and a data signal is written.

When the transistors 431_1 are turned off, the pixels 411 in which the data has been written are brought into a holding state. This operation is sequentially performed row by row; thus, an image is displayed.

The pixel 411 illustrated in FIG. 24C includes a transistor 431_2, a capacitor 433_2, a transistor 434, and a light-emitting element 435. The transistor 100 disclosed in the above embodiment can be used as the transistor 431_2. Further, the transistor 100 disclosed in the above embodiment can be used as the transistor 434.

One of a source electrode and a drain electrode of the transistor 431_2 is electrically connected to a wiring to which a data signal is supplied (hereinafter referred to as signal line DL_n). A gate electrode of the transistor 431_2 is electrically connected to a wiring to which a gate signal is supplied (hereinafter referred to as scan line GL_m).

The transistor 431_2 has a function of controlling whether to write a data signal by being turned on or off.

One of a pair of electrodes of the capacitor 433_2 is electrically connected to a node 436, and the other is electrically connected to a node 437.

The capacitor 433_2 functions as a storage capacitor for storing written data.

One of a source electrode and a drain electrode of the transistor 434 is electrically connected to the potential supply line VL_a. Furthermore, a gate electrode of the transistor 434 is electrically connected to the node 436.

One of an anode and a cathode of the light-emitting element 435 is electrically connected to a potential supply line VL_b, and the other is electrically connected to the node 437.

As the light-emitting element 435, an organic electroluminescent element (also referred to as an organic EL element) or the like can be used, for example. Note that the light-emitting element 435 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

In the display device including the pixel 411 in FIG. 24C, the pixels 411 are sequentially selected row by row by the scan line driver circuit 404, whereby the transistors 431_2 are turned on and a data signal is written.

When the transistors 431_2 are turned off, the pixels 411 in which the data has been written are brought into a holding state. Further, the amount of current flowing between the source electrode and the drain electrode of the transistor 434 is controlled in accordance with the potential of the written data signal. The light-emitting element 435 emits light with a luminance corresponding to the amount of flowing current. This operation is sequentially performed row by row; thus, an image is displayed.

This embodiment can be combined as appropriate with any of the other embodiments in this specification.

Embodiment 7

In this embodiment, a display module using a semiconductor device of one embodiment of the present invention is described with reference to FIG. 25.

In a display module 8000 in FIG. 25, a touch panel 8004 connected to an FPC 8003, a cell 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, or the like is not provided in some cases.

The semiconductor device of one embodiment of the present invention can be used for the cell 8006, for example.

The shapes and sizes of the upper cover 8001 and the lower cover 8002 can be changed as appropriate in accordance with the sizes of the touch panel 8004 and the cell 8006.

The touch panel 8004 can be a resistive touch panel or a capacitive touch panel and may be formed to overlap with the cell 8006. A counter substrate (sealing substrate) of the cell 8006 can have a touch panel function. A photosensor may be provided in each pixel of the cell 8006 so that an optical touch panel is obtained. An electrode for a touch sensor may be provided in each pixel of the cell 8006 so that a capacitive touch panel is obtained.

The backlight unit 8007 includes a light source 8008. The light source 8008 may be provided at an end portion of the backlight unit 8007 and a light diffusing plate may be used.

The frame 8009 may protect the cell 8006 and also function as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet.

This embodiment can be combined as appropriate with any of the other embodiments in this specification.

Embodiment 8

In this embodiment, examples of an electronic device that uses a semiconductor device of one embodiment of the present invention will be described.

Specific examples of the electronic device that uses the semiconductor device of one embodiment of the present invention are as follows: display devices of televisions, monitors, and the like, lighting devices, desktop and laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, large game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects and the like driven by electric motors using power from a power storage unit are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 26A:
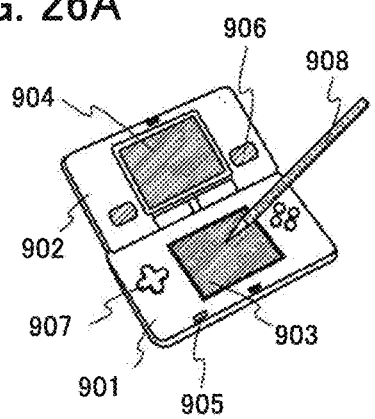
FIGS. 26A to 26F illustrate electronic devices of one embodiment of the present invention.

FIG. 26A illustrates an example of a portable game console including a housing 901, a housing 902, a display portion 903, a display portion 904, a microphone 905, a speaker 906, an operation key 907, a stylus 908, and the like. Although the portable game machine in FIG. 26A has the two display portions 903 and 904, the number of display portions included in a portable game machine is not limited to this.

Figure 26B:
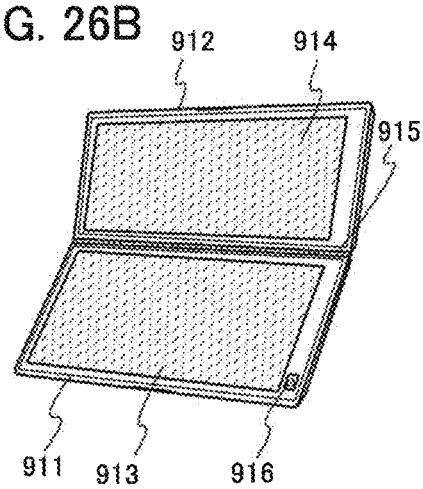

FIG. 26B illustrates an example of a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 26C:
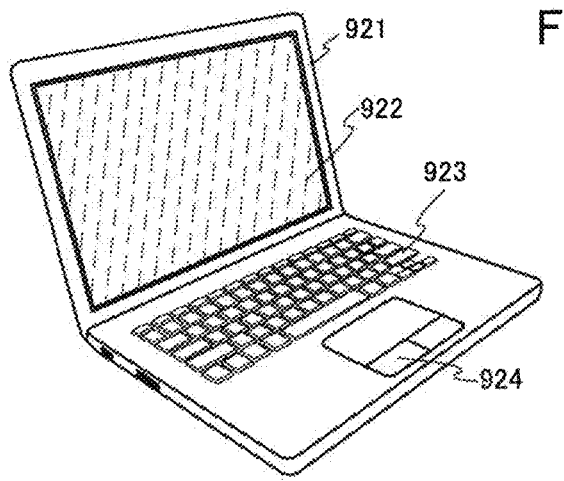

FIG. 26C illustrates an example of a laptop personal computer, which includes a housing 921, a display portion 922, a keyboard 923, a pointing device 924, and the like.

Figure 26D:
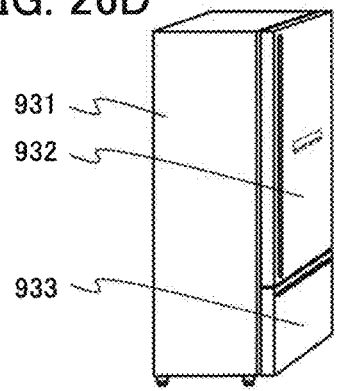

FIG. 26D illustrates an example of an electric refrigerator-freezer including a housing 931, a door for a refrigerator 932, a door for a freezer 933, and the like.

Figure 26E:
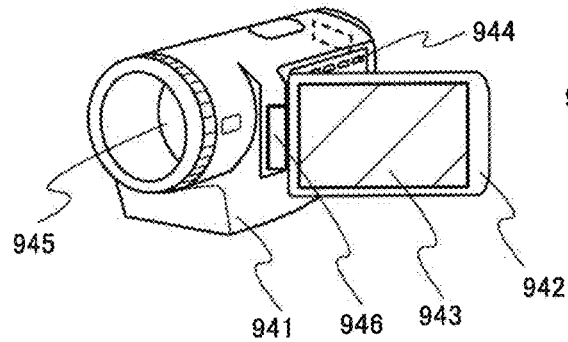

FIG. 26E illustrates an example of a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 26F:
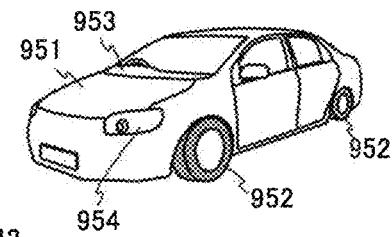

FIG. 26F illustrates an example of an automobile including a car body 951, wheels 952, a dashboard 953, lights 954, and the like.

This embodiment can be combined as appropriate with any of the other embodiments in this specification.

Example 1

In this example, samples were fabricated by forming an insulating layer containing oxygen at a higher proportion than oxygen in the stoichiometric composition over each of tungsten, indium tin oxide to which silicon is added (hereinafter also referred to as "ITOSi"), indium gallium zinc oxide (hereinafter also referred to as "IGZO"), and indium gallium zinc oxide to which nitrogen is added (hereinafter also referred to as "IGZON"). The amount of oxygen molecules released by heating was analyzed by TDS, and the following are results of the analysis.

<Formation of Samples>

Figure 27A:
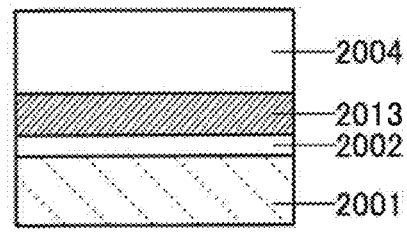
FIG. 27A illustrates a cross-sectional structure of samples used in Example 1 and FIG. 27B shows analysis results.

FIG. 27A is a schematic diagram of a cross-sectional structure of the samples. In each of the samples, a 100-nm-thick thermal oxide film 2002 was formed over a single crystal silicon substrate 2001, a barrier layer 2013 was formed over the thermal oxide film 2002, and a 300-nm-thick silicon oxide layer 2004 containing oxygen at a higher proportion than oxygen in the stoichiometric composition was formed by a sputtering method over the barrier layer 2013.

[Sample 2010]

The sample including, as the barrier layer 2013, a 150-nm-thick tungsten layer formed by a sputtering method is referred to as a sample 2010.

[Sample 2020]

The sample including, as the barrier layer 2013, a 50-nm-thick ITOSi layer formed by a sputtering method is referred to as a sample 2020.

[Sample 2030]

The sample including, as the barrier layer 2013, a 50-nm-thick IGZO layer formed by a sputtering method using a target with an atomic ratio of In:Ga:Zn=1:1:1 and a mixed gas of oxygen and argon as a sputtering gas is referred to as a sample 2030.

[Sample 2040]

The sample including, as the barrier layer 2013, a 50-nm-thick IGZO layer formed by a sputtering method using a target with an atomic ratio of In:Ga:Zn=1:1:1 and argon as a sputtering gas is referred to as a sample 2040.

[Sample 2050]

The sample including, as the barrier layer 2013, a 50-nm-thick IGZON layer formed by a sputtering method using a target with an atomic ratio of In:Ga:Zn=1:1:1 and nitrogen as a sputtering gas is referred to as a sample 2050.

<TDS Analysis Results>

Figure 27B:
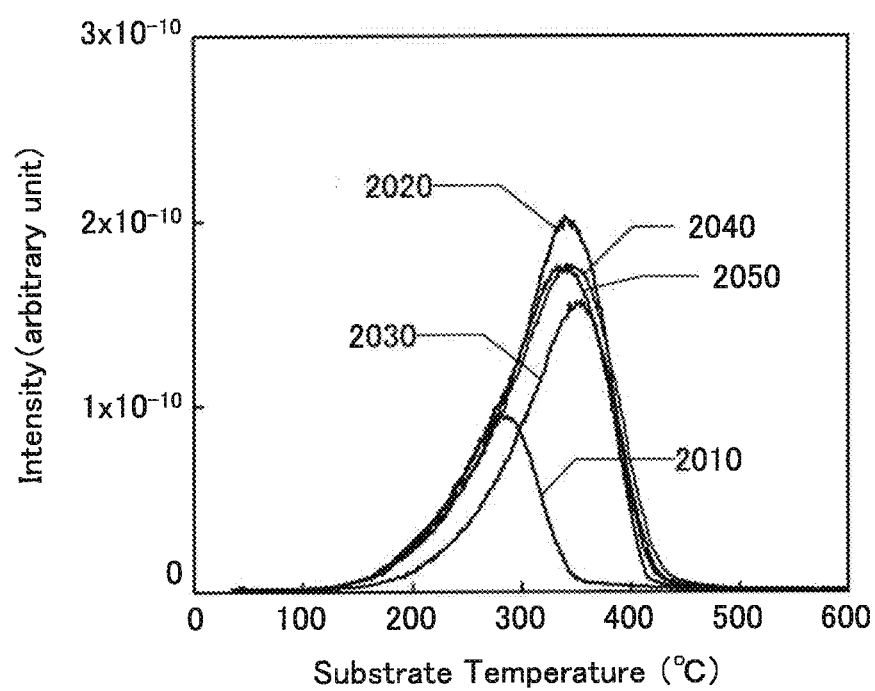

Thermal desorption spectroscopy (TDS) analyses were performed on the samples 2010 to 2050. FIG. 27B shows the amount of released m/z=32 gas (oxygen molecule) measured by TDS. In FIG. 27B, the horizontal axis indicates substrate temperature, and the vertical axis indicates the signal intensity that is proportional to the amount of released gas having a specific molecular weight. Note that the total number of molecules released to the outside corresponds to the integral value of the signal intensity. Thus, with the degree of the peak intensity, the total number of molecules contained in the oxide insulating film can be estimated.

In FIG. 27B, the amount of released oxygen molecules of the samples 2020 to 2050 is larger than that of the sample 2010. In the sample 2010, most of the oxygen contained in the silicon oxide layer 2004 is presumed to have diffused into the barrier layer 2013 formed of tungsten. In the samples 2020 to 2050, it is presumed that oxygen contained in the silicon oxide layer 2004 was released to the outside because oxygen did not easily pass through the barrier layers 2013, causing the larger amounts of released oxygen molecules.

According to this example, tungsten is a material that easily transmits oxygen. Furthermore, ITOSi, IGZO, and IGZON are materials that do not easily transmit oxygen.

Example 2

In this example, the amount of oxygen molecules released by heating from an insulating layer containing oxygen at a higher proportion than oxygen in the stoichiometric composition, which was formed over each of tungsten, ITOSi, IGZO, and IGZO, was analyzed by TDS using samples different from those of Example 1. The results of the analysis are described.

<Formation of Samples>

Figure 28A:
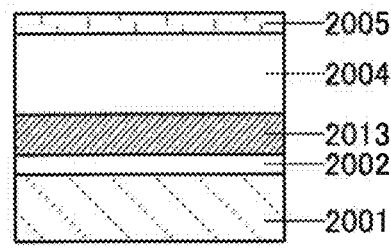
FIGS. 28A and 28B illustrate cross-sectional structures of samples used in Example 2 and FIG. 28C shows analysis results.
Figure 28B:
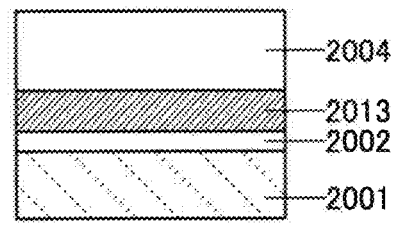

A cross-sectional structure of the fabricated samples and a manufacturing method thereof are described with reference to FIGS. 28A and 28B. First, the same samples as those of Example 1 were fabricated, and then a cap layer 2005 was formed over the 300-nm-thick silicon oxide layer 2004 containing oxygen at a higher proportion than oxygen in the stoichiometric composition. As the cap layer 2005, a 50-nm-thick IGZO layer formed by a sputtering method using a target with an atomic ratio of In:Ga:Zn=1:1:1 and a mixed gas of oxygen and argon as a sputtering gas was used (see FIG. 28A).

Next, heat treatment was performed on the above samples at 450° C. for 1 hour in a nitrogen atmosphere. Then, heat treatment was performed at 450° C. for 1 hour in an oxygen atmosphere. After the heat treatment, the cap layer 2005 was removed to expose the silicon oxide layer 2004 (see FIG. 28B).

[Sample 2110]

The sample including, as the barrier layer 2013, the 150-nm-thick tungsten layer formed by a sputtering method is referred to as a sample 2110.

[Sample 2120]

The sample including, as the barrier layer 2013, the 50-nm-thick ITOSi layer formed by a sputtering method is referred to as a sample 2120.

[Sample 2130]

The sample including, as the barrier layer 2013, the 50-nm-thick IGZO layer formed by a sputtering method using a target with an atomic ratio of In:Ga:Zn=1:1:1 and a mixed gas of oxygen and argon as a sputtering gas is referred to as a sample 2130.

[Sample 2140]

The sample including, as the barrier layer 2013, the 50-nm-thick IGZO layer formed by a sputtering method using a target with an atomic ratio of In:Ga:Zn=1:1:1 and argon as a sputtering gas is referred to as a sample 2140.

[Sample 2150]

The sample including, as the barrier layer 2013, the 50-nm-thick IGZON layer formed by a sputtering method using a target with an atomic ratio of In:Ga:Zn=1:1:1 and nitrogen as a sputtering gas is referred to as a sample 2150.

<TDS Analysis Results>

Figure 28C:
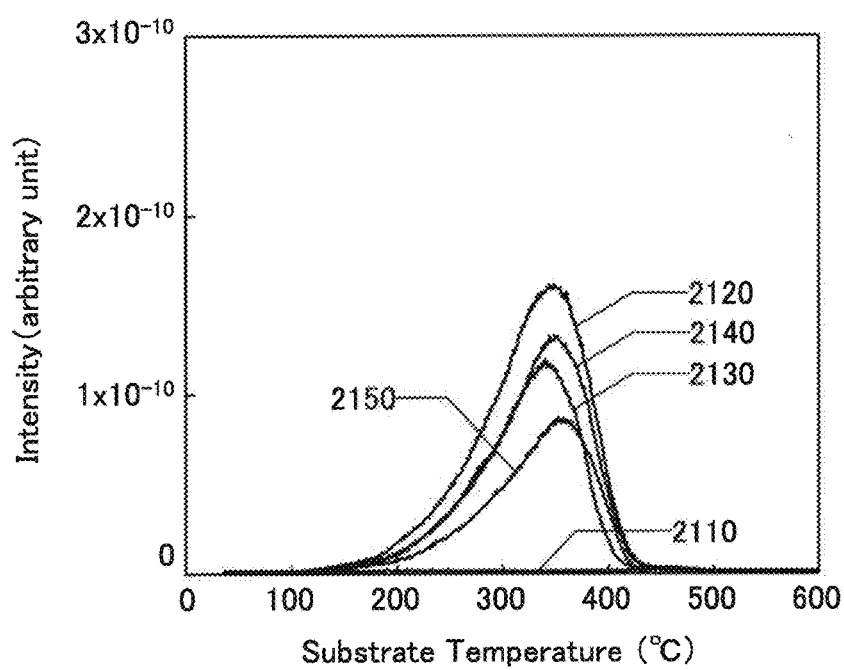

Thermal desorption spectroscopy (TDS) analyses were performed on the samples 2110 to 2150. FIG. 28C shows the amount of released m/z=32 gas (oxygen molecule) measured by TDS. In FIG. 28C, the horizontal axis indicates substrate temperature, and the vertical axis indicates the signal intensity that is proportional to the amount of released gas having a specific molecular weight.

In FIG. 28C, released oxygen molecules can be hardly seen from the sample 2110. In contrast, the samples 2120 to 2150 show release of oxygen molecules clearly. In the sample 2110, the heat treatment with the cap layer 2005 presumably made most of the oxygen in the silicon oxide layer 2004 whose amount was in excess of the amount of oxygen in the stoichiometric composition diffused into the barrier layer 2013 formed of tungsten. In the samples 2120 to 2150, it is presumed that because oxygen did not easily pass through the barrier layers 2013 and the cap layer 2005, most of the oxygen whose amount is in excess of the amount of oxygen in the stoichiometric composition stayed in the silicon oxide layer 2004 even through the heat treatment.

According to this example, tungsten is a material that easily transmits oxygen. Furthermore, ITOSi, IGZO, and IGZON are materials that do not easily transmit oxygen.

This application is based on Japanese Patent Application serial no. 2013-219459 filed with Japan Patent Office on Oct. 22, 2013, the entire contents of which are hereby incorporated by reference.

What is claimed is:

1. A semiconductor device comprising:
a first conductive film;
a second conductive film over the first conductive film;
a first insulating film in direct contact with a side surface of the first conductive film;
a second insulating film over the second conductive film and the first insulating film;
a first oxide semiconductor film over the second insulating film;
a second oxide semiconductor film over the first oxide semiconductor film;
a source electrode and a drain electrode over the second oxide semiconductor film;
a third oxide semiconductor film over the second oxide semiconductor film, the source electrode and the drain electrode,
a third insulating film over the third oxide semiconductor film;
a third conductive film over the third oxide semiconductor film with the third insulating film provided therebetween; and
a fourth insulating film over the third conductive film,
wherein the fourth insulating film is in contact with the third conductive film, a side surface of the third insulating film and a side surface of the third oxide semiconductor film.

2. The semiconductor device according to claim 1, wherein the second insulating film is in contact with a top surface of the second conductive film.

3. The semiconductor device according to claim 1, wherein the side surface of the third insulating film is aligned with a side surface of the third conductive film.

4. The semiconductor device according to claim 1, wherein the second conductive film comprises indium tin oxide, indium tin oxide containing silicon, phosphorus, boron, nitrogen, or carbon, or indium gallium zinc oxide containing silicon, phosphorus, boron, nitrogen, or carbon.

5. The semiconductor device according to claim 1, wherein the fourth insulating film comprises aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, or tantalum oxide.

6. The semiconductor device according to claim 1, wherein an electron affinity of the second oxide semiconductor film is larger than an electron affinity of the first oxide semiconductor film and an electron affinity of the third oxide semiconductor film.

7. The semiconductor device according to claim 1, wherein the second insulating film comprises aluminum oxide.

8. A semiconductor device comprising:
a first conductive film;
a second conductive film over the first conductive film;
a first insulating film in direct contact with a side surface of the first conductive film;
a second insulating film over the second conductive film and the first insulating film;

a first oxide semiconductor film over the second insulating film;

a second oxide semiconductor film over the first oxide semiconductor film;

a source electrode and a drain electrode over the second oxide semiconductor film;

a third oxide semiconductor film over the second oxide semiconductor film, the source electrode and the drain electrode, a third insulating film over the third oxide semiconductor film;

a third conductive film over the third oxide semiconductor film with the third insulating film provided therebetween; and a fourth insulating film over the third conductive film, wherein the second insulating film is in contact with a top surface of the second conductive film, and wherein the fourth insulating film is in contact with the second insulating film.

9. The semiconductor device according to claim 8, wherein a side surface of the third insulating film is aligned with a side surface of the third conductive film.

10. The semiconductor device according to claim 8, wherein the second conductive film comprises indium tin oxide, indium tin oxide containing silicon, phosphorus, boron, nitrogen, or carbon, or indium gallium zinc oxide containing silicon, phosphorus, boron, nitrogen, or carbon.

11. The semiconductor device according to claim 8, wherein the second conductive film comprises indium gallium zinc oxide containing nitrogen.

12. The semiconductor device according to claim 8, wherein the fourth insulating film comprises aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, or tantalum oxide.

13. The semiconductor device according to claim 8, wherein an electron affinity of the second oxide semiconductor film is larger than an electron affinity of the first oxide semiconductor film and an electron affinity of the third oxide semiconductor film.

14. The semiconductor device according to claim 8, wherein the second insulating film comprises aluminum oxide.

* * * * *